United States Patent
Funyuu et al.

(10) Patent No.: US 9,537,101 B2
(45) Date of Patent: Jan. 3, 2017

(54) COMPOSITION CAPABLE OF CHANGING ITS SOLUBILITY, HOLE TRANSPORT MATERIAL COMPOSITION, AND ORGANIC ELECTRONIC ELEMENT USING THE SAME

(71) Applicant: HITACHI CHEMICAL COMPANY, LTD., Tokyo (JP)

(72) Inventors: Shigeaki Funyuu, Tsuchiura (JP); Naoki Asano, Tsukuba (JP); Kenichi Ishitsuka, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/972,225

(22) Filed: Dec. 17, 2015

(65) Prior Publication Data

US 2016/0111647 A1    Apr. 21, 2016

Related U.S. Application Data

(62) Division of application No. 14/347,063, filed as application No. PCT/JP2012/074687 on Sep. 26, 2012, now Pat. No. 9,252,376.

(30) Foreign Application Priority Data

Sep. 26, 2011    (JP) .................. 2011-209610

(51) Int. Cl.
    *C08G 65/00*    (2006.01)
    *H01L 51/00*    (2006.01)
    (Continued)

(52) U.S. Cl.
    CPC .......... *H01L 51/0036* (2013.01); *C08G 61/12* (2013.01); *C08G 61/126* (2013.01); *C08L 65/00* (2013.01);
    (Continued)

(58) Field of Classification Search
    CPC ....... C08G 73/026; C09K 11/06; H01B 1/128; H05B 33/14; H01L 51/0043
    See application file for complete search history.

(56) References Cited

U.S. PATENT DOCUMENTS 8,865,025 B2    10/2014    Seshadri et al.
2009/0256117 A1    10/2009    Seshadri et al.
(Continued)

FOREIGN PATENT DOCUMENTS

CN    101490864 A    7/2009
CN    102056959 A    5/2011
(Continued)

OTHER PUBLICATIONS

Carlos A. Zuniga et al., Approaches to Solution-Processed multilayer Organic Light-Emitting Diodes Based on Cross-Linking, Chemistry of Materials, 2011, pp. 658-681, vol. 23, No. 3.
(Continued)

*Primary Examiner* — Shane Fang
(74) *Attorney, Agent, or Firm* — Fitch, Even, Tabin & Flannery LLP

(57) ABSTRACT

An embodiment of the present invention relates to a composition containing a polymer oroligomer (A) having a repeating unit with hole transport properties and also having a thienylgroup which may have a substituent, and an initiator (B), wherein the solubility of the composition is capable of being changed by applying heat, light, or both heat and light.

20 Claims, 2 Drawing Sheets

(51) Int. Cl.
   *C08G 61/12*   (2006.01)
   *C08L 65/00*   (2006.01)
   *C09D 11/52*   (2014.01)
   *H01L 51/42*   (2006.01)
   *H01L 51/50*   (2006.01)

(52) U.S. Cl.
   CPC ........... *C09D 11/52* (2013.01); *H01L 51/0035* (2013.01); *H01L 51/0043* (2013.01); *H01L 51/50* (2013.01); *C08G 2261/132* (2013.01); *C08G 2261/135* (2013.01); *C08G 2261/312* (2013.01); *C08G 2261/3142* (2013.01); *C08G 2261/3162* (2013.01); *C08G 2261/3223* (2013.01); *C08G 2261/411* (2013.01); *C08G 2261/512* (2013.01); *C08G 2261/76* (2013.01); *H01L 51/42* (2013.01); *H01L 51/426* (2013.01); *H01L 51/5012* (2013.01); *H01L 51/5056* (2013.01); *Y02E 10/549* (2013.01)

(56) References Cited

U.S. PATENT DOCUMENTS

| | | |
|---|---|---|
| 2009/0321723 A1 | 12/2009 | Hoshi et al. |
| 2010/0109000 A1 | 5/2010 | Mathai et al. |
| 2011/0114926 A1 | 5/2011 | Okabe et al. |

FOREIGN PATENT DOCUMENTS

| | | |
|---|---|---|
| CN | 102106017 A | 6/2011 |
| EP | 2 762 514 | 8/2014 |
| JP | 2004-199935 | 7/2004 |
| JP | 2007-302886 | 11/2007 |
| JP | 2007-311262 | 11/2007 |
| JP | 2010-67960 | 3/2010 |
| JP | 2013-72022 | 4/2013 |
| JP | 5288084 | 6/2013 |
| WO | 2005/053056 A1 | 6/2005 |
| WO | 2011/078387 A1 | 6/2011 |

OTHER PUBLICATIONS

Conjugated Triblock Copolymers Containing Both Electron-Donor and Electron-acceptor Blocks, Macromolecules, 2006, pp. 4327-4331, vol. 39, No. 13.
Notification of Transmittal of Translation of the International Preliminary Report on Patentability, mailed Apr. 10, 2014, for International Application No. PCT/JP2012/074687.
Japanese Official Action dated Jul. 29, 2014, for JP Application No. 2013-118989.
European Search Report issued on Mar. 12, 2015, in counterpart European application No. 12837270.3.
Z. Zhu, et al., "Stabilization of Film Morphology in Polymer-Fullerene Heterojunction Solar Cells," Journal of Macromolecular Science, Part A—Pure and Applied Chemistry, vol. 41(12), 2004, pp. 1467-1487.
Yusuf Yagci, et al., "Photoinduced Polymerization of Thiophene Using Iodonium Salt," Macromol. Chem. Phys., vol. 206, 2005, pp. 1178-1182.
Office Action mailed May 29, 2015, for Chinese Application No. 201280046988.4, and English translation thereof.
English language machine translation of JP 2007-302886.
Office Action mailed Feb. 15, 2016, for Taiwanese Application No. 101135378, together with English language translation thereof.
Office Action mailed Jul. 19, 2016, for Taiwanese Application No. 101135378, together with English language translation thereof.

COMPOSITION CAPABLE OF CHANGING ITS SOLUBILITY, HOLE TRANSPORT MATERIAL COMPOSITION, AND ORGANIC ELECTRONIC ELEMENT USING THE SAME

CROSS-REFERENCE TO RELATED APPLICATIONS

This application is a divisional of U.S. application Ser. No. 14/347,063, filed Mar. 25, 2014, which is a U.S. national phase application filed under 35 U.S.C. §371 of International Application PCT/JP2012/074687, filed on Sep. 26, 2012, claiming priority from Japanese Application No. 2011-209610, filed on Sep. 26, 2011, the contents of each of which are incorporated herein by reference in their entirety.

TECHNICAL FIELD

Embodiments of the present invention relate to a composition capable of changing its solubility, a hole transport material composition, and an ink composition. Further, other embodiments of the present invention relate to an organic layer that uses the composition capable of changing its solubility, the hole transport material composition or the ink composition, and a method for forming the organic layer. Furthermore, yet other embodiments of the present invention relate to an organic electronic element, an organic electroluminescent element (hereafter also referred to as an organic EL element) and an organic photoelectric conversion element having the organic layer. Moreover, yet other embodiments of the present invention relate to a display element and an illumination device that use the organic EL element.

BACKGROUND ART

Organic electronic elements are elements which perform electrical actions using organic matter. It is expected that organic electronic elements will be able to provide advantages such as energy conservation, low prices and superior flexibility, and they are attracting considerable attention as an alternative technology to conventional inorganic semiconductors based mainly on silicon.

Among organic electronic elements, organic EL elements are attracting attention, for example, as substitutes for incandescent lamps or gas-filled lamps in large-surface area solid state light source applications. Further, they are also attracting attention as the self-luminous display most likely to replace liquid crystal displays (LCD) in the field of flat panel displays (FPO), and commercialization of organic EL elements continues to progress.

Organic EL elements are broadly classified into two types depending on the organic material used, namely low-molecular weight organic EL elements and polymer organic EL elements. Low-molecular weight materials are used as the organic material for low-molecular weight organic EL elements, and polymer materials are used as the organic material for polymer organic EL elements. Compared with low-molecular weight organic EL elements, for which film formation is mainly performed in a vacuum system, polymer organic EL elements can employ simple film formation methods such as printing or inkjet application. Accordingly, it is expected that polymer organic EL elements will be indispensible elements for future large-screen organic EL displays.

Both low-molecular weight organic EL elements and polymer organic EL elements have already been researched intensively, but improving properties of the elements such as the luminous efficiency and the lifetime of the element remain problems. Using multiple layers for the organic layer that constitutes the organic EL element is used as one method of addressing these problems.

In a low-molecular weight organic EL element, because film formation is generally performed by a vapor deposition method, multilayering can be easily achieved by sequentially changing the compound used in the vapor deposition. On the other hand, multilayering is problematic in polymer organic EL elements. The reason for this problem is that, in polymer organic EL elements, because film formation is performed by a wet process such as printing or inkjet application, the previously formed lower layer dissolves during formation of the upper layer. In order to enable multilayering of a polymer organic EL element, a method is required in which the already formed lower layer does not change during formation of the upper layer.

In order to achieve multilayering, investigations have been conducted into the use of compounds having significantly different solubility levels. One typical example of this method is an element having a 2-layer structure consisting of a hole injection layer composed of polythiophene:polystyrene sulfonic acid {PEDOT:PSS) formed using a water dispersion, and a light-emitting layer formed using an aromatic organic solvent such as toluene. In this case, because the hole injection layer composed of PEDOT:PSS does not dissolve in the aromatic organic solvent, the 2-layer structure can be produced.

However, in this element, the removal of water is problematic, and water can cause a deterioration in the properties of the organic EL element. Further, because drying at a high temperature and/or for a long period of time is performed to remove the water, preparation of an organic EL element using a resin substrate is difficult. Furthermore, there are considerable limitations associated with processes in which reduced pressure conditions are required for the removal of water.

Another method for achieving multilayering that is being investigated utilizes reactions between compounds {for example, see Non-Patent Document 1, Patent Document 1, and Patent Document 2). These documents disclose methods of achieving multilayering by reacting a polymerizable substituent that has been introduced into a compound. For example, these methods include multilayering that uses the polymerization reaction of a silyl group, styryl group, oxetane group or acrylic group or the like, and multilayering that uses the dimerization of a trifluorovinyl ether group or a benzocyclobutene group or the like.

CITATION LIST

Patent Literature

Patent Document 1: JP 2004-199935
Patent Document 2: WO 2005/053056

Non-Patent Literature

Non-Patent Document 1: Carlos A. Zuniga, Stephen Barlow, and Seth R. Marder, "Approaches to Solution-Processed Multilayer Organic Light-Emitting Diodes Based on Cross-Linking", Chem. Mater., 2011, 23 (3), pp. 658 to 681.

SUMMARY OF INVENTION

Technical Problem

However, in the methods mentioned above, when producing the organic EL elements, the polymerizable substituents must be introduced into the compounds used in forming the organic layers.

An effective multilayering method is required in general for organic electronic elements in which two adjacent organic layers are formed by application, and for example, is also required for organic photoelectric conversion elements in which two adjacent layers (for example, a buffer layer and a photoelectric conversion layer) are formed by application.

Accordingly, an object of one embodiment of the present invention is to provide a composition, a hole transport material composition and an ink composition which enable multilayering of organic layers using a coating method. Further, an object of another embodiment of the present invention is to provide an organic layer that can be multilayered using a coating method, and a method for forming the organic layer. Furthermore, an object of yet another embodiment of the present invention is to provide an organic electronic element, an organic EL element and an organic photoelectric conversion element having an organic layer formed by a coating method. Moreover, an object of yet another embodiment of the present invention is to provide a display element and an illumination device which use an organic EL element having an organic layer formed by a coating method.

Solution to Problem

As a result of intensive investigation, the inventors of the present invention discovered that by applying heat and/or light to a thin film formed using a composition containing a polymer or oligomer having a repeating unit with hole transport properties and also having a thienyl group, and an initiator, the solubility of the thin film in solvents changed, and they were therefore able to complete the present invention.

In other words, one embodiment of the present invention relates to a composition comprising a polymer or oligomer (A) having a repeating unit with hole transport properties and also having a thienyl group which may have a substituent, and an initiator (B), wherein solubility of the composition is capable of being changed by applying heat, light, or both heat and light, and further relates to a hole transport material composition and an ink composition comprising the composition.

Further, other embodiments of the present invention relate to an organic layer (I) formed by applying the composition capable of changing its solubility, the hole transport material composition, or the ink composition; a method for changing the solubility of the organic layer (1), the method comprising a step of applying heat, light, or both heat and light to the organic layer (I); and an organic layer (II) obtained by applying heat, light, or both heat and light to the organic layer (I).

Furthermore, yet other embodiments of the present invention relate to an organic electronic element, an organic electroluminescent element and an organic photoelectric conversion element comprising the organic layer (II).

Moreover, yet other embodiments of the present invention relate to a display element and an illumination device using the organic electroluminescent element.

Examples of the above embodiments are described below.

Examples of the aforementioned composition capable of changing its solubility include compositions in which the repeating unit with hole transport properties comprises at least one type of repeating unit selected from the group consisting of a repeating unit containing an aromatic amine structure and a repeating unit containing a carbazole structure; compositions in which the polymer or oligomer (A) has at least one type of structure selected from the group consisting of a structure represented by formula (Ia) shown below, and a structure represented by formula (Ib) shown below; compositions in which the polymer or oligomer (A) has the thienyl group at a terminal thereof; compositions in which the polymer or oligomer (A) has a branched structure and 3 or more terminals, and has a thienyl group at each of 3 or more of all of the terminals; compositions in which the polymer or oligomer {A} has at least one type of structure selected from the group consisting of a structure represented by formula (IIa), a structure represented by formula {IIb), a structure represented by formula (IIIa), and a structure represented by formula (IIIb), all of which are shown below; compositions in which the initiator (B) is an oxidizing agent; compositions in which the initiator (B) is an onium salt; compositions in which the weight-average molecular weight of the polymer or oligomer (A) is from 1,000 to 1,000,000; and compositions further comprising a solvent (C).

Furthermore, examples of the aforementioned organic electronic element include elements comprising at least two electrodes, and the organic layer (II) positioned between the electrodes; examples of the aforementioned organic electroluminescent element include elements comprising an anode, the organic layer (II), a light-emitting layer and a cathode; and examples of the aforementioned organic photoelectric conversion element include elements comprising an anode, the organic layer (II), a photoelectric conversion layer and a cathode.

This Application is related to the subject matter disclosed in Japanese Application 2011-209610 filed on Sep. 26, 2011, the entire contents of which are incorporated herein by reference.

Advantageous Effects of Invention

Embodiments of the present invention can provide a composition, a hole transport material composition and an ink composition which enable multilayering of organic layers using a coating method. Further, other embodiments of the present invention can provide an organic layer that can be multilayered using a coating method, and a method for forming the organic layer. Furthermore, yet other embodiments of the present invention can provide an organic electronic element, an organic EL element and an organic photoelectric conversion element having an organic layer formed by a coating method. Moreover, yet other embodiments of the present invention can provide a display element and an illumination device which use an organic EL element having an organic layer formed by a coating method.

DESCRIPTION OF EMBODIMENTS

Figure 1:
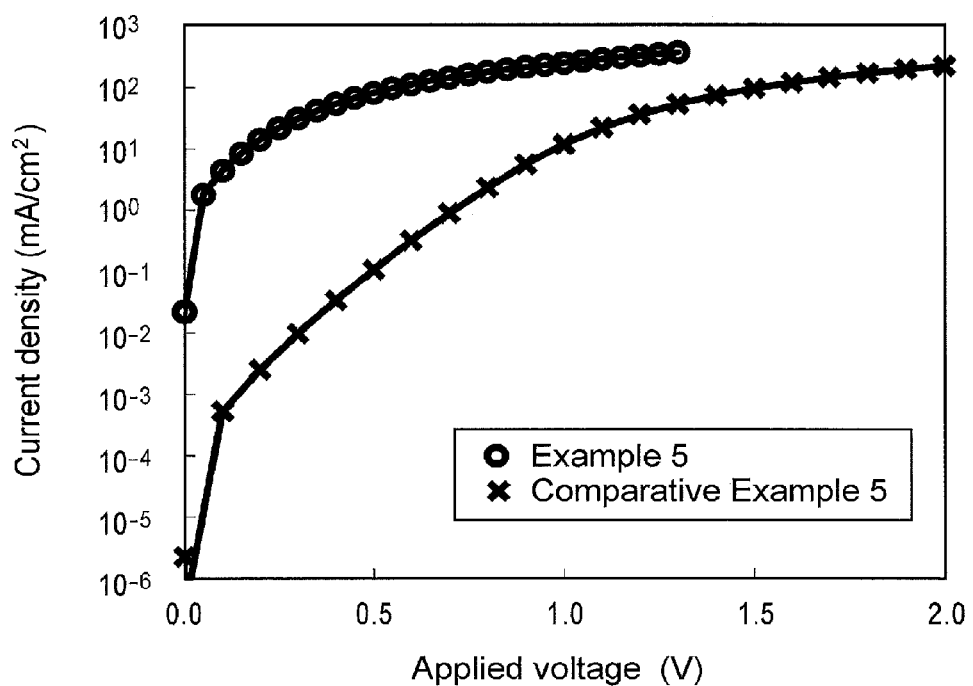
FIG. 1 is a graph illustrating the current-voltage characteristics of elements obtained in Example 5 and Comparative Example 5.

Embodiments of the present invention are described below.

[Composition Capable of Changing its Solubility]

A composition capable of changing its solubility which represents one embodiment of the present invention is a composition comprising a polymer or oligomer (A) having a repeating unit with hole transport properties and also having a thienyl group which may have a substituent, and an initiator (B), wherein the solubility of the composition can be changed by applying heat, light, or both heat and light. If necessary, the composition capable of changing its solubility may further comprise a solvent (C). Further, the composition capable of changing its solubility may contain one type of each of the polymer or oligomer (A), the initiator (B) and the solvent (C), or may comprise 2 or more types of each component.

[Polymer or Oligomer (A)]

The repeating unit with hole transport properties may be any repeating unit having the ability to transport holes, and examples include repeating units containing an aromatic amine structure, repeating units containing a carbazole structure, and repeating units containing a thiophene structure. Repeating units containing an aromatic amine structure and repeating units containing a carbazole structure are preferable. The polymer or oligomer {A) may include 2 or more types of these units. Further, the polymer or oligomer (A) may have a branched structure in the molecule, and have 3 or more terminals. A branched structure describes a structure in which the polymer or oligomer chain has a branch section, and has repeating units extending in 3 or more directions from the branch section. A polymer or oligomer (A) having a branched structure and having 3 or more terminals is composed of a main chain and one or more side chains.

Examples of repeating units with hole transport properties are shown below in formulas (1a) to (93a). The repeating units represented by formulas (85a) to {93a) have a branch section.

<Formulas (1a) to (84a)>

[Chemical Formula 1]

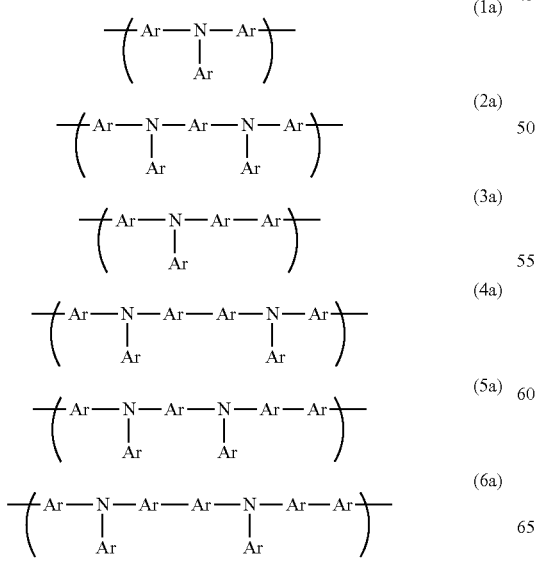

[Chemical Formula 2]

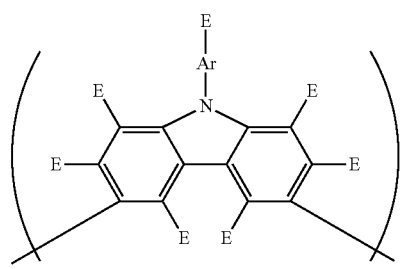

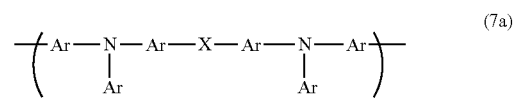

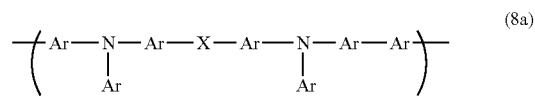

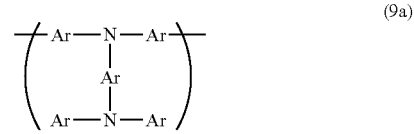

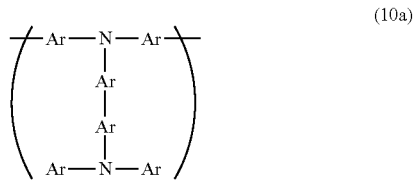

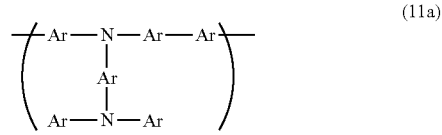

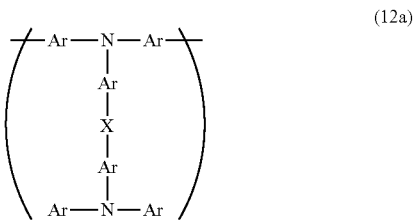

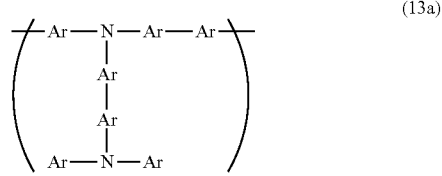

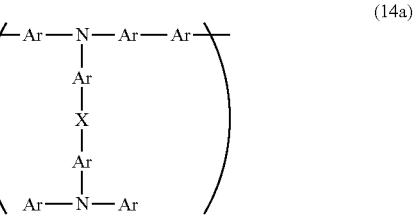

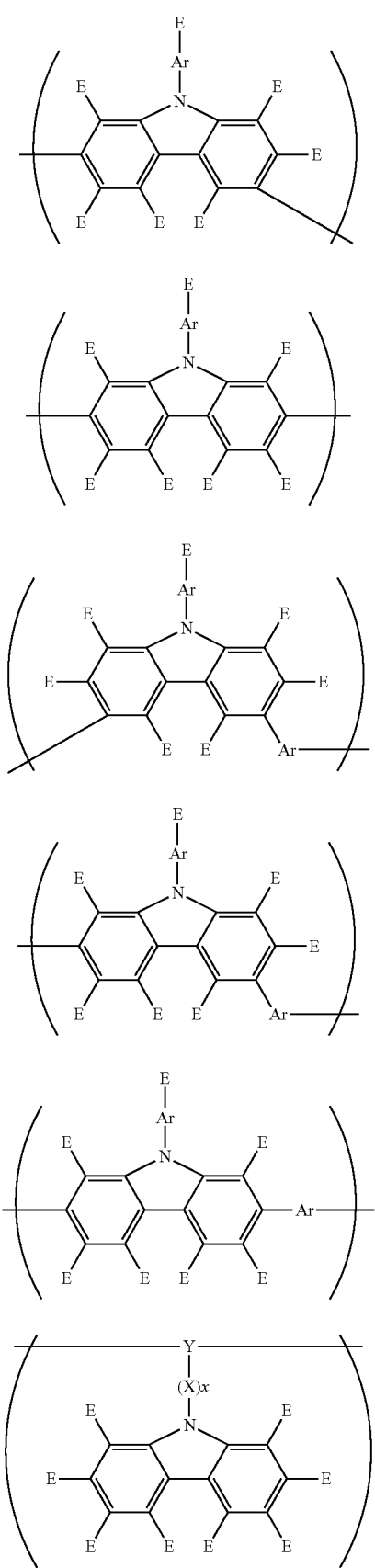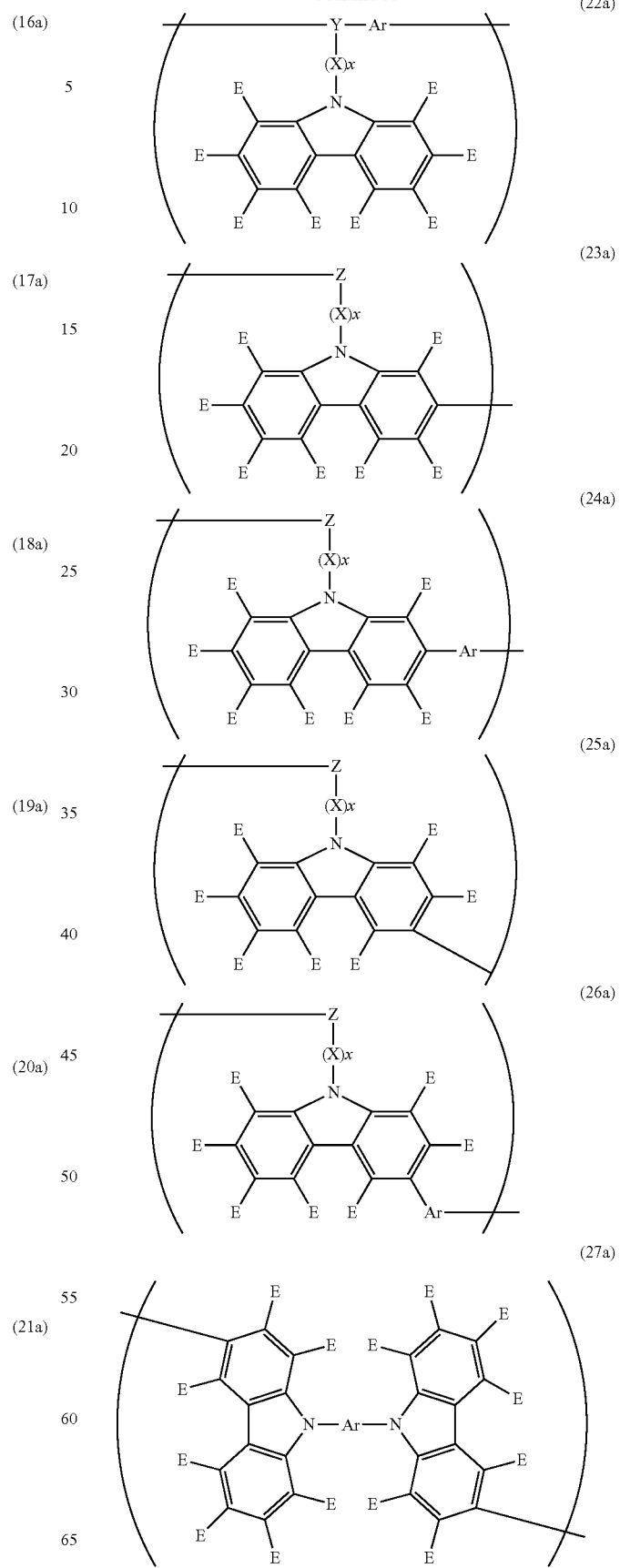

(28a)
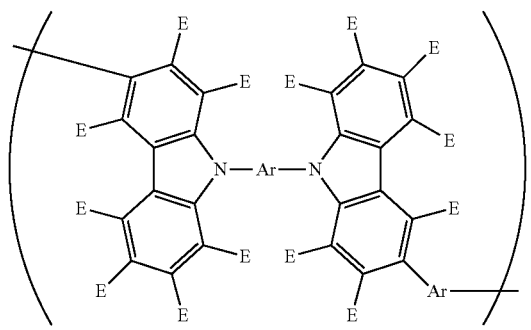
[Chemical Formula 3]
(29a)
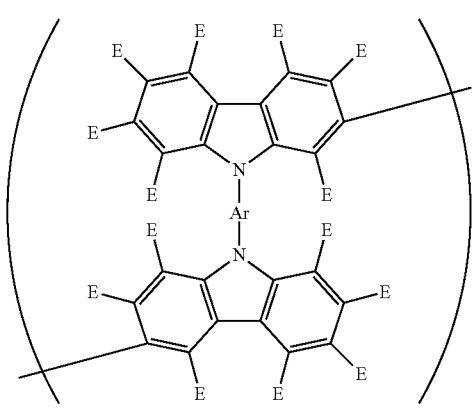
(30a)
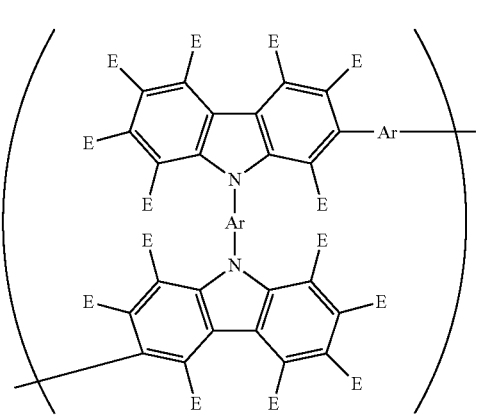
(31a)
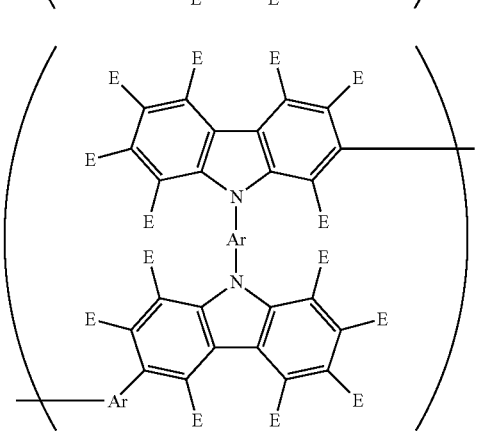
(32a)
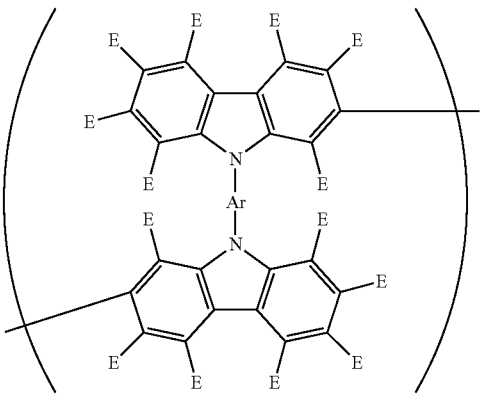
(33a)
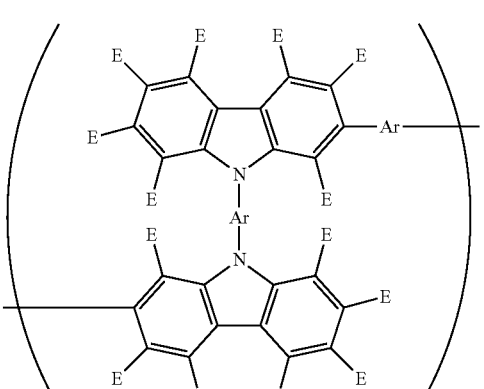
[Chemical Formula 4]
(34a)
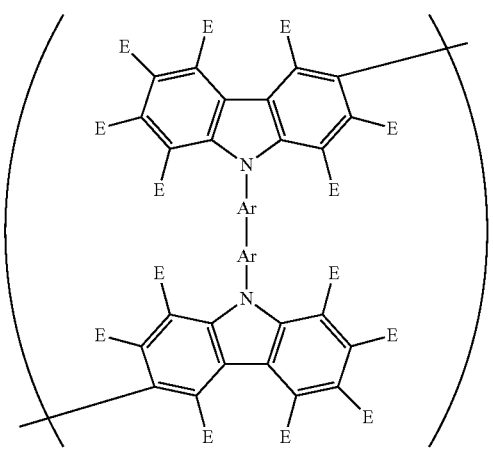

(35a)
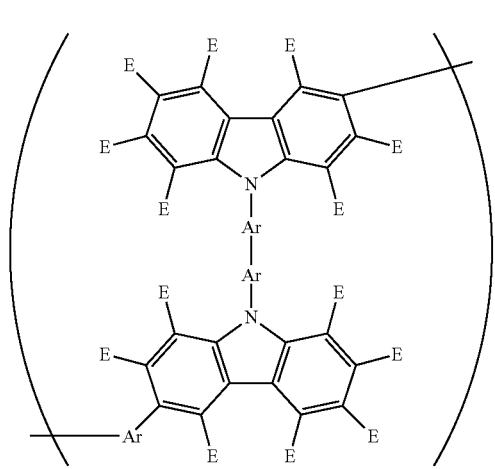
(36a)
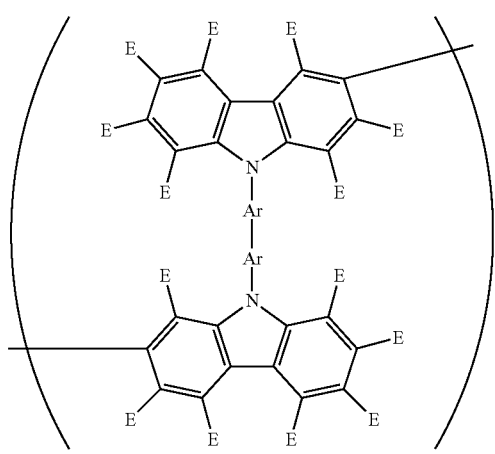
(37a)
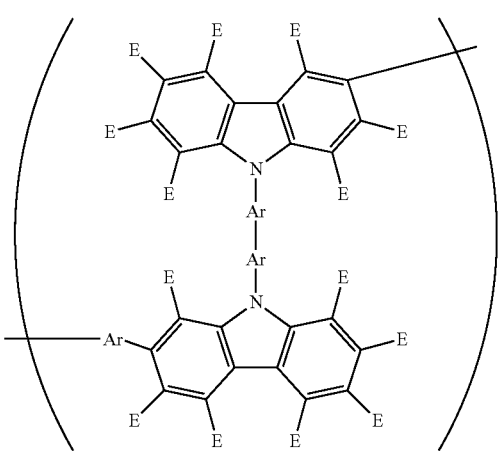
(38a)
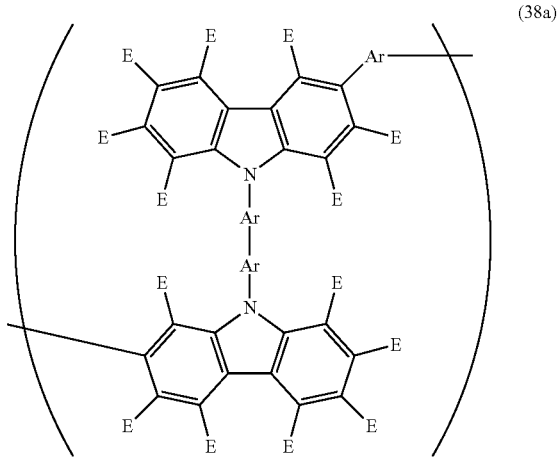
(39a)
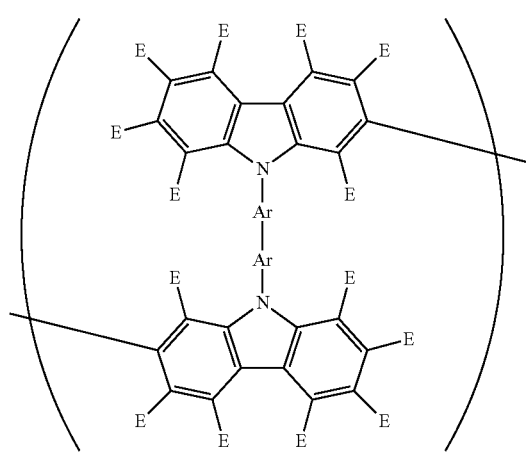
[Chemical Formula 5]
(40a)
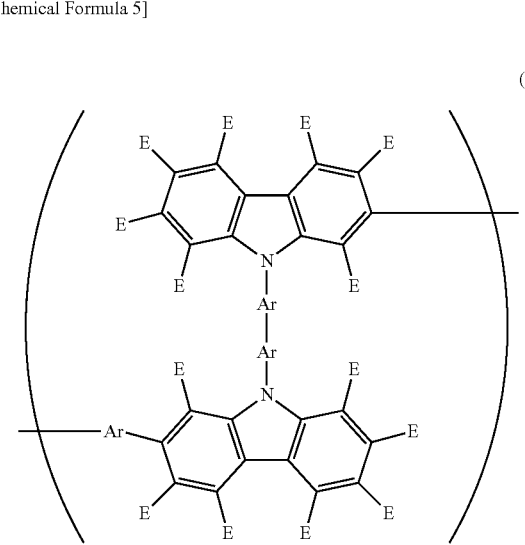

(41a)
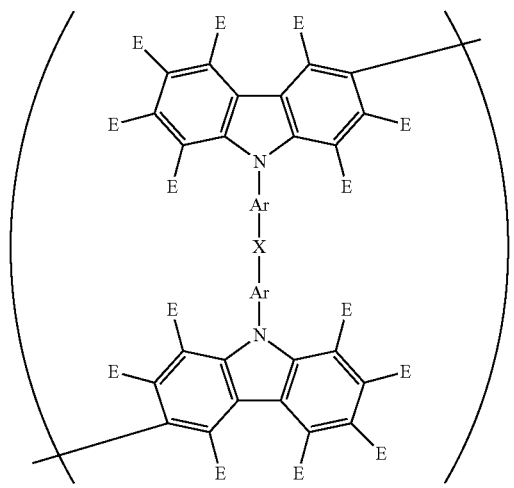
(42a)
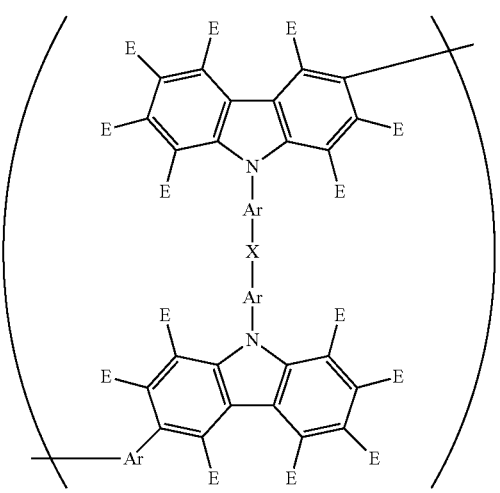
(43a)
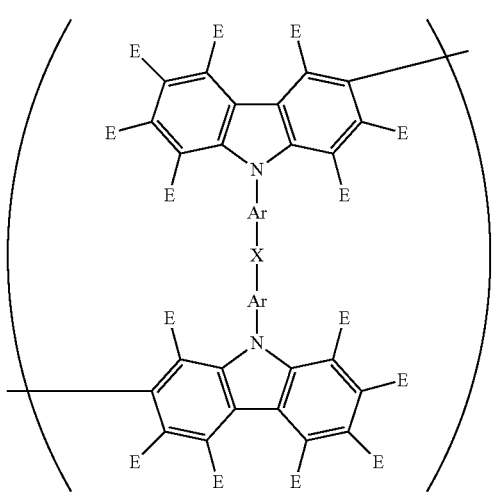
(44a)
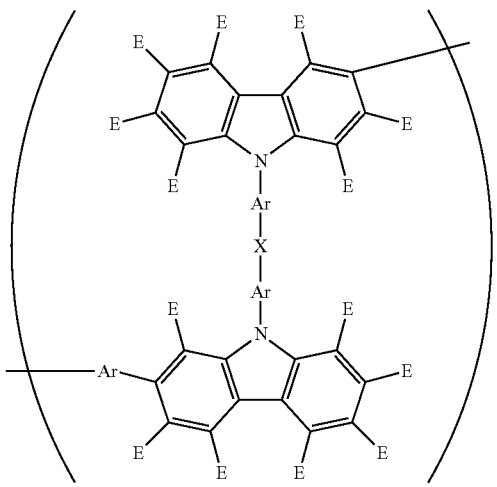
[Chemical Formula 6]
(45a)
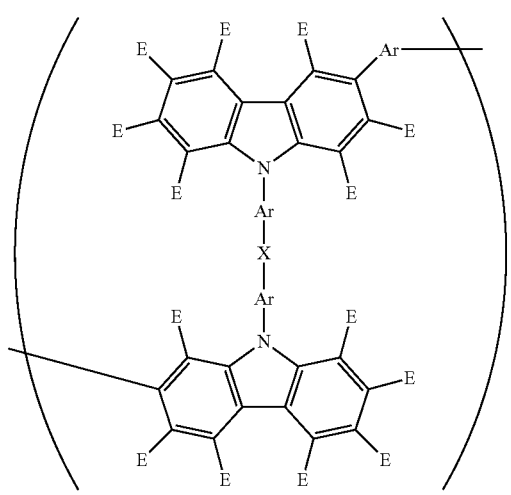
(46a)
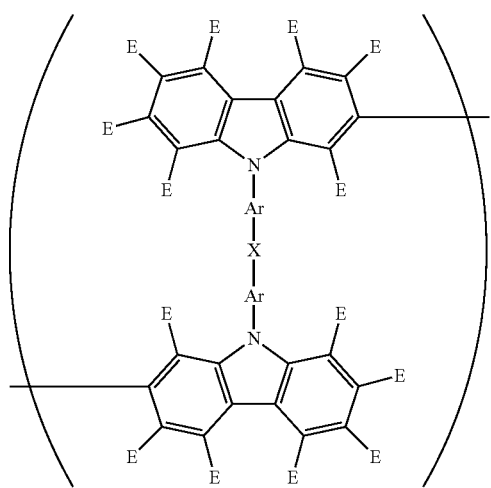

[Chemical Formula 7]
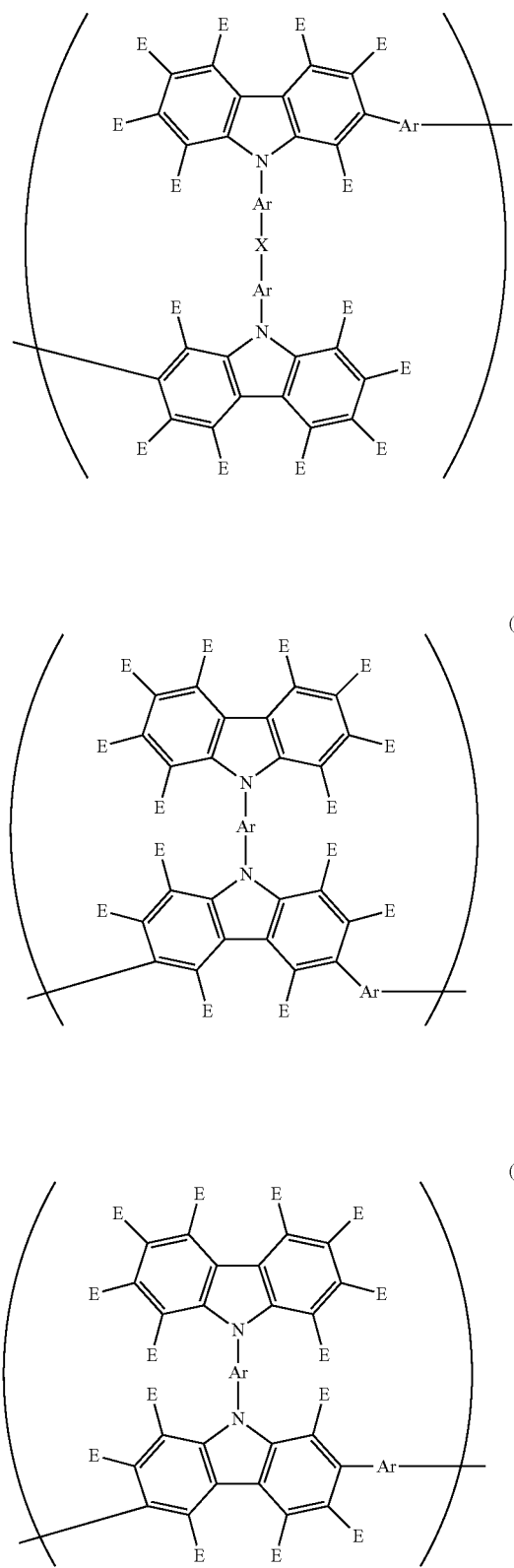
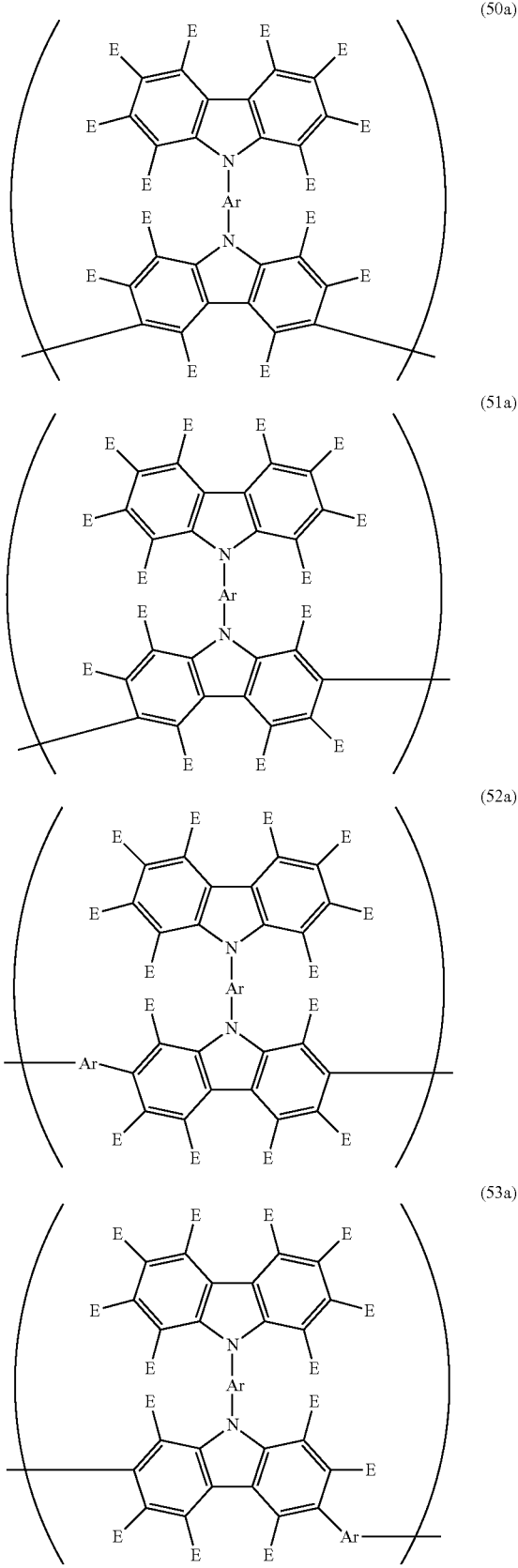

(54a) 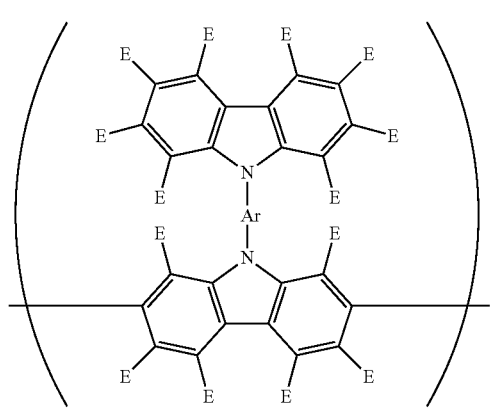
(57a) 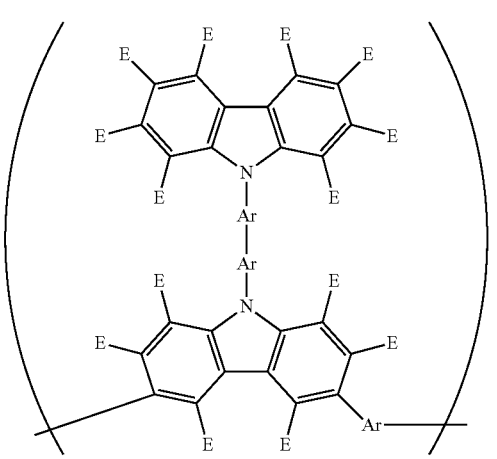
[Chemical Formula 8]
(55a) 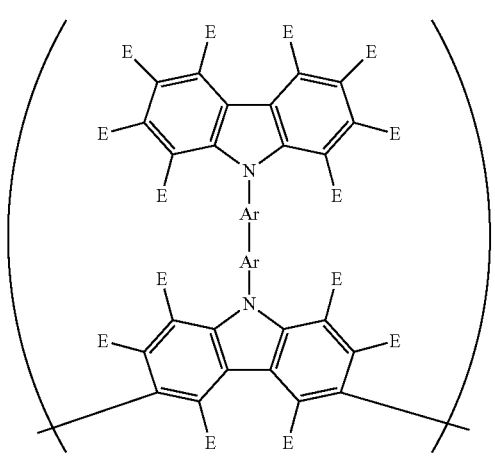
(58a) 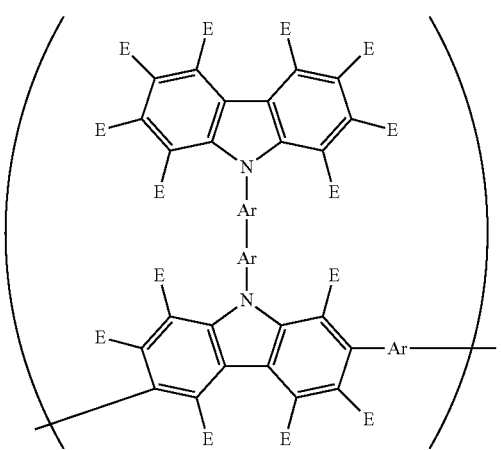
(56a) 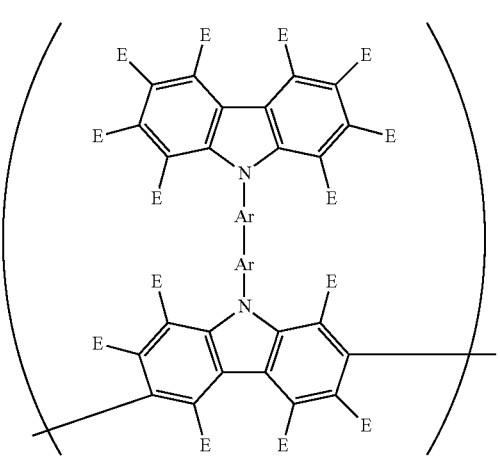
(59a) 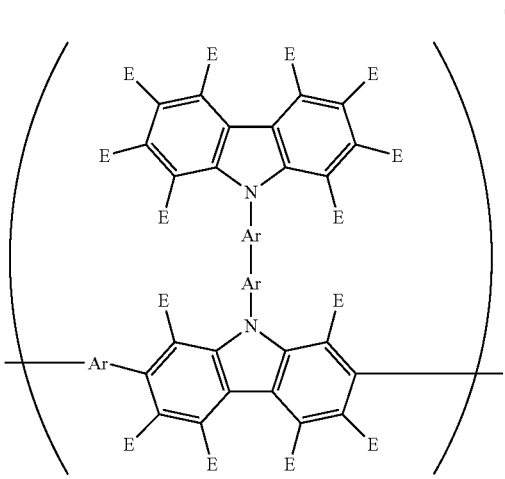

[Chemical Formula 9]
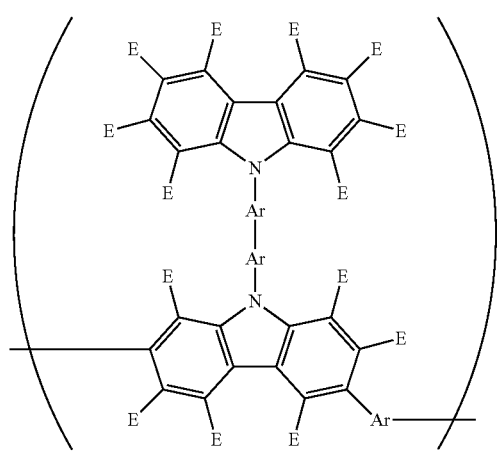 (60a)
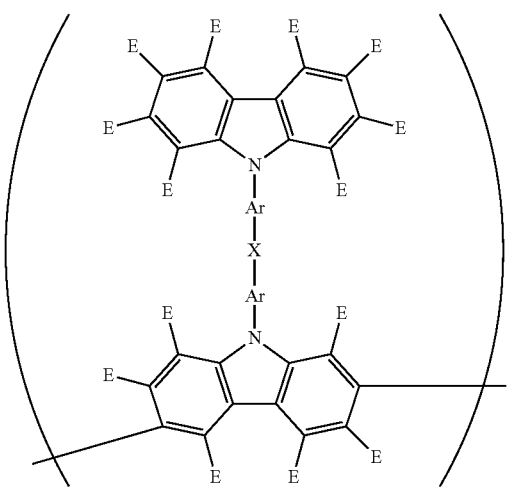 (63a)
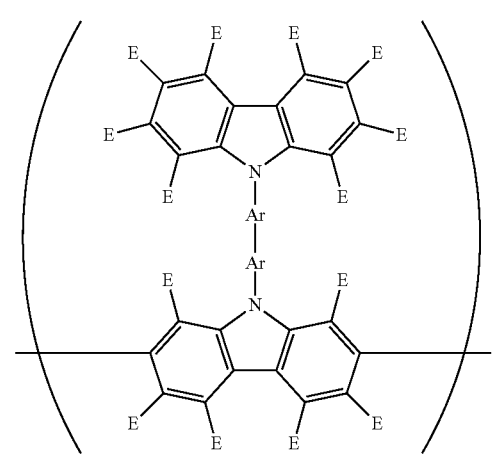 (61a)
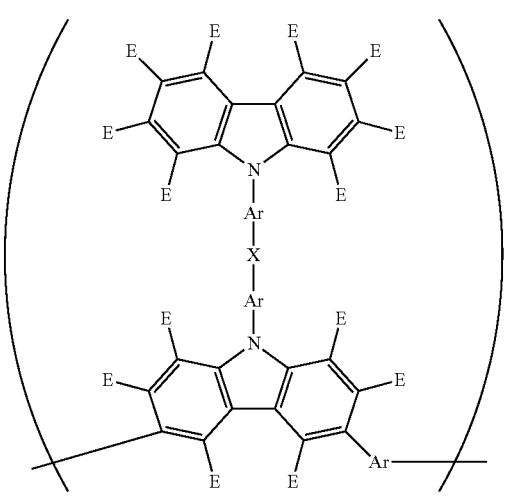 (64a)
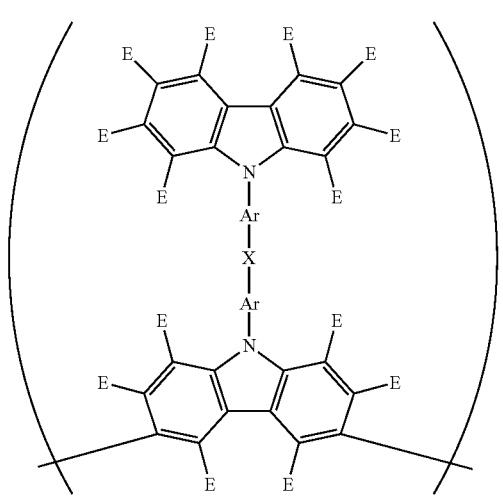 (62a)
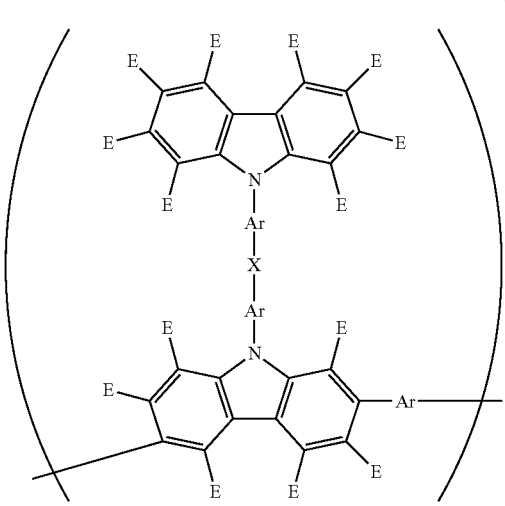 (65a)

[Chemical Formula 10]
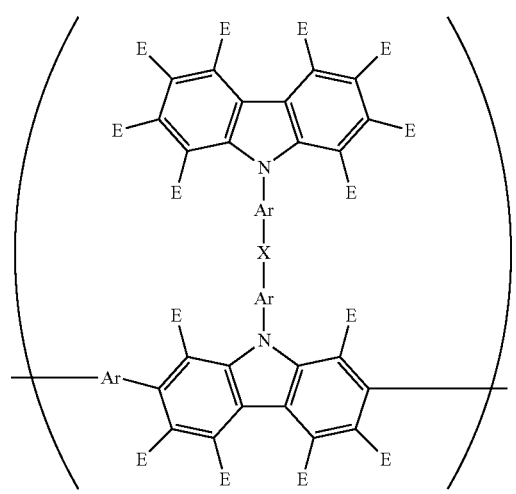
(66a)
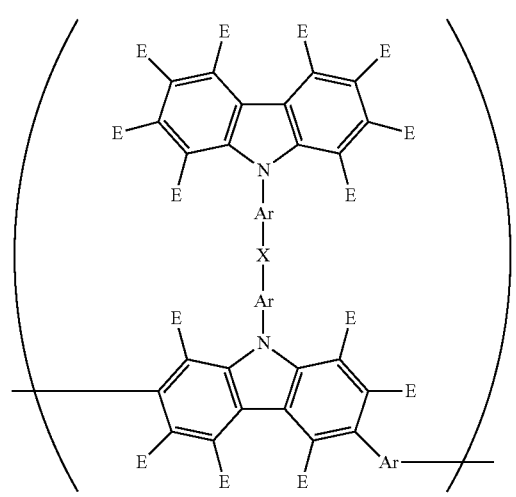
(67a)
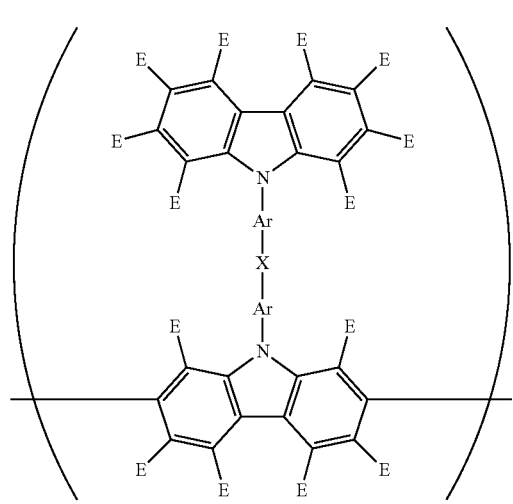
(68a)
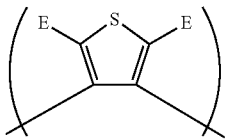
(69a)
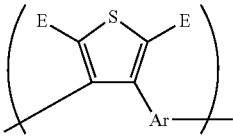
(70a)
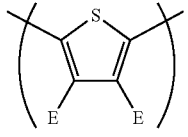
(71a)
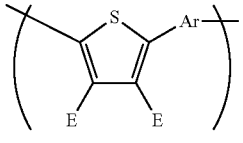
(72a)
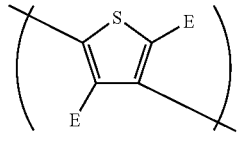
(73a)
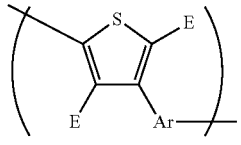
(74a)
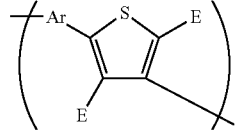
(75a)
[Chemical Formula 11]
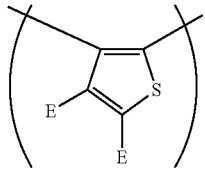
(76a)
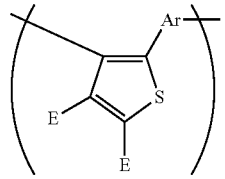
(77a)

(78a) 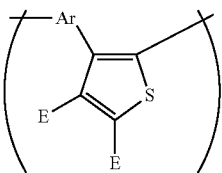

[Chemical Formula 12]

(79a) 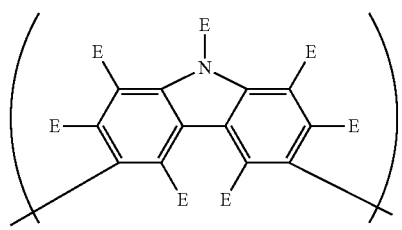

(80a)

(81a)

(82a) 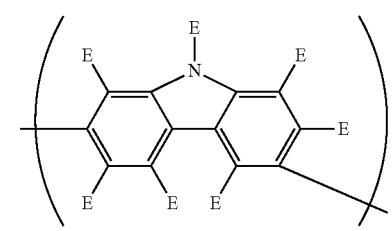

(83a) 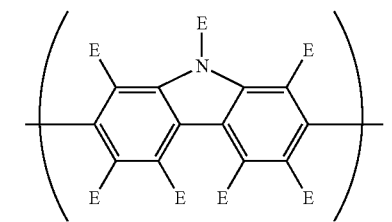

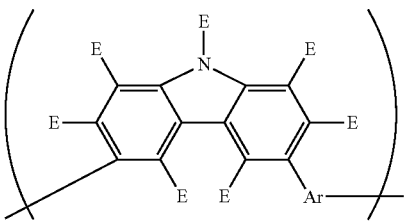

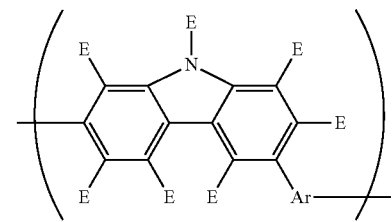

(84a) 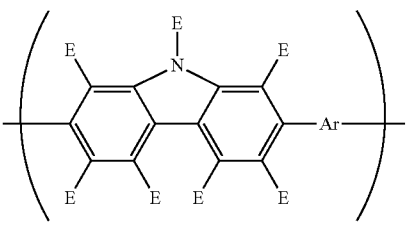

In formulas (1a) to (84a), each E independently represents one of —R$^1$, —OR$^2$, —SR$^3$, —OCOOR$^4$, —COOR$^5$, —SiR$^6$R$^7$R$^8$, or the following (a) to (c):

[Chemical Formula 13]

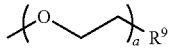 (a)

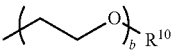 (b)

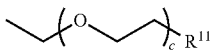 (c)

wherein each of R$^1$ to R$^{11}$ represents a hydrogen atom, a linear, cyclic or branched alkyl group of 1 to 22 carbon atoms, or an aryl group or heteroaryl group of 2 to 30 carbon atoms, and each of a, b and c represents an integer of 1 or greater. Here, an aryl group refers to an atomic group in which one hydrogen atom has been removed from an aromatic hydrocarbon, and may have a substituent, whereas a heteroaryl group refers to an atomic group in which one hydrogen atom has been removed from an aromatic compound containing a hetero atom, and may have a substituent. Examples of the substituent include an alkyl group, alkoxy group, alkylthio group, aryl group, aryloxy group, arylthio group, arylalkyl group, arylalkoxy group, arylalkylthio group, arylalkenyl group, arylalkynyl group, hydroxyl group, hydroxyalkyl group, amino group, substituted amino group, silyl group, substituted silyl group, silyloxy group, substituted silyloxy group, halogen atom, acyl group, acyloxy group, imino group, amide group (—(NH)—COR), imide group (—N(COR)z), carboxyl group, substituted carboxyl group, cyano group, and monovalent heterocyclic group. Further, each of a, b and c preferably represents an integer of 1 to 4.

In the preceding description, examples of the alkyl group include a methyl group, ethyl group, n-propyl group, n-butyl group, n-pentyl group, n-hexyl group, n-heptyl group, n-octyl group, n-nonyl group, n-decyl group, n-undecyl group, n-dodecyl group, isopropyl group, isobutyl group, sec-butyl group, tert-butyl group, 2-ethylhexyl group, 3,7-dimethyloctyl group, cyclohexyl group, cycloheptyl group and cyclooctyl group. Examples of the aryl group include phenyl, biphenylyl, terphenylyl, naphthalenyl, anthracenyl, tetracenyl, fluorenyl and phenanthrenyl groups. Examples of the heteroaryl group include pyridinyl, pyrazinyl, quinolinyl, isoquinolinyl, acridinyl, phenanthrolinyl, furanyl, pyrrolyl, thiophenyl, carbozolyl, oxazolyl, oxadiazolyl, thiadiazolyl, triazolyl, benzoxazolyl, benzoxadiazolyl, benzothiadiazolyl, benzotriazolyl and benzothiophenyl groups. These same examples can be used as the alkyl groups, aryl groups and heteroaryl groups mentioned in the following description.

Each Ar independently represents either an arylene group or heteroarylene group of 2 to 30 carbon atoms, or an aryl group or heteroaryl group of 2 to 30 carbon atoms. The arylene group is an atomic group in which 2 hydrogen atoms have been removed from an aromatic hydrocarbon, and may have a substituent, whereas the heteroarylene group is an atomic group in which 2 hydrogen atoms have been removed from an aromatic compound containing a hetero atom, and may have a substituent. Further, the aryl group is an atomic group in which one hydrogen atom has been removed from an aromatic hydrocarbon, and may have a substituent, whereas the heteroaryl group is an atomic group in which one hydrogen atom has been removed from an aromatic compound containing a hetero atom, and may have a substituent. Examples of the substituents mentioned here include the same groups as those mentioned above for E.

Examples of the arylene group include phenylene, biphenyldiyl, terphenyldiyl, naphthalenediyl, anthracenediyl, tetracenediyl, fluorenediyl and phenanthrenediyl groups. Examples of the heteroarylene groups include pyridinediyl, pyrazinediyl, quinolinediyl, isoquinolinediyl, acridinediyl, phenanthrolinediyl, furandiyl, pyrrolediyl, thiophenediyl, carbazolediyl, oxazolediyl, oxadiazolediyl, thiadiazolediyl, triazolediyl, benzoxazolediyl, benzoxadiazolediyl, benzothiadiazolediyl, benzotriazolediyl and benzothiophenediyl groups. These same examples can be used as the arylene groups (arenediyl groups) and the heteroarylene groups (heteroarenediyl groups) mentioned in the following description.

Each of X and Z independently represents a divalent linking group, and although there are no particular limitations, a group in which an additional one hydrogen atom has been removed from a group, among those described above for E, having one or more hydrogen atoms, or a group belonging to a linking group set (A) shown below is preferable. Further, x represents an integer of 0 to 2. Y represents a trivalent linking group, and although there are no particular limitations, a group in which an additional 2 hydrogen atoms have been removed from a group, among those described above for E, having 2 or more hydrogen atoms is preferable.

<Linking Group Set (A)>

[Chemical Formula 14]

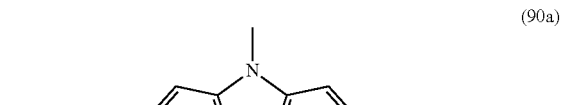

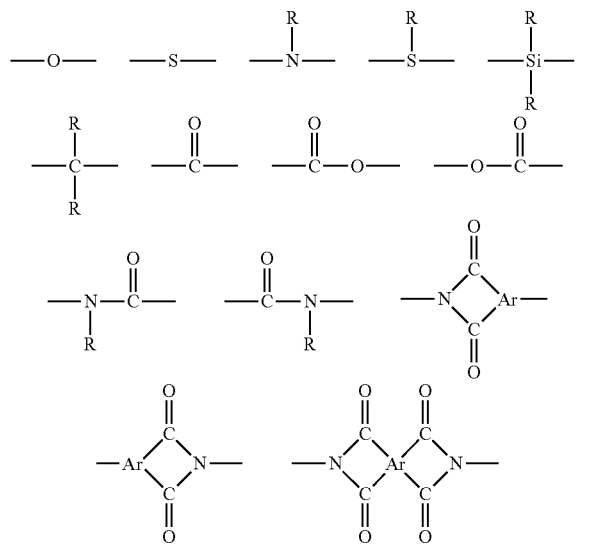

In the formulas, each R independently represents a hydrogen atom, a linear, cyclic or branched alkyl group of 1 to 22 carbon atoms which may have a substituent, or an aryl group or heteroaryl group of 2 to 30 carbon atoms which may have a substituent. Ar represents a trivalent or tetravalent linking group, and is preferably an atomic group in which an additional one or two hydrogen atoms have been removed from an arylene group or heteroarylene group of 2 to 30 carbon atoms.

<Formulas (85a) to (93a)>

[Chemical Formula 15]

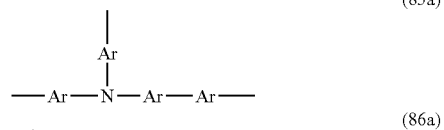

(85a)

(86a)

(87a)

(88a)

(89a)

[Chemical Formula 16]

(90a)

(91a)

(92a)

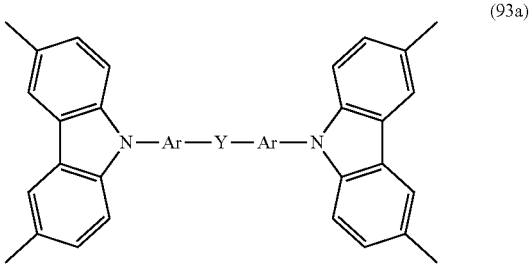

(93a)

In formulas (85a) to (93a), each Ar independently represents an arylene group or heteroarylene group of 2 to 30 carbon atoms, or an aryl group or heteroaryl group of 2 to 30 carbon atoms, and Y represents a divalent linking group. Each of the units represented by formulas (85a) to (93a) may have a substituent, and examples of the substituent include the same groups as those mentioned above for E in formulas (1 a) to (84a).

In formulas (89a) and (93a), Y is preferably a divalent linking group represented by one of the following formulas.

[Chemical Formula 17]

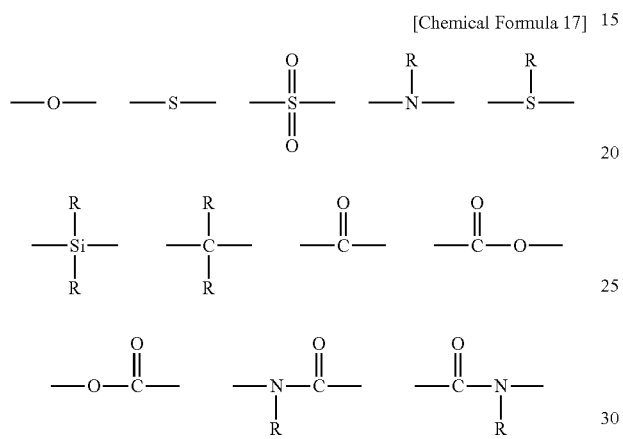

In the above formulas, each R independently represents a hydrogen atom, a linear, cyclic or branched alkyl group of 1 to 22 carbon atoms which may have a substituent, or an aryl group or heteroaryl group of 2 to 30 carbon atoms which may have a substituent.

Specific examples of formulas (85a) and (86a) include formulas (85a-1) and (86a-1) shown below. Only examples of formulas (85a) and (86a) are shown below, but examples of formulas (87a) to (89a) and formulas (91a) to (93a) include similar units in which Ar represents a benzene ring which may have a substituent.

[Chemical Formula 18]

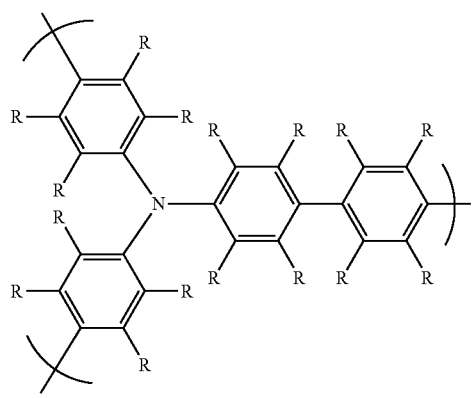

(85a-1)

-continued

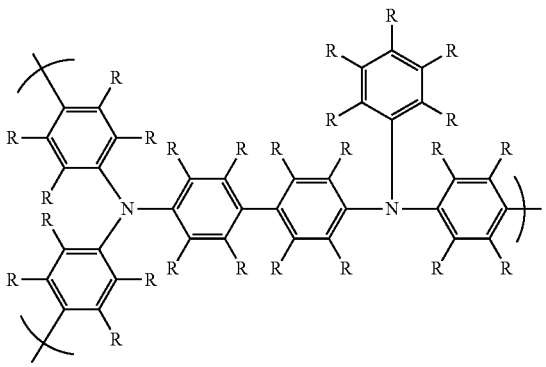

(86a-1)

In formulas (85a-1) and (86a-1), each R independently represents a hydrogen atom, a halogen atom, or a monovalent organic group. Examples of the monovalent organic group represented by R include linear, cyclic or branched alkyl groups of 1 to 22 carbon atoms, and aryl or heteroaryl groups of 2 to 30 carbon atoms, and these groups may have a group bonded via an ether linkage.

The polymer or oligomer (A) may also be a copolymer having 2 or more repeating units. The copolymer may be an alternating, random, block or graft copolymer. A copolymer having an intermediate structure between these types, such as a random copolymer having block-like properties may also be used.

In order to adjust the solubility, heat resistance or electrical properties, the polymer or oligomer (A) may also be a copolymer having, besides the repeating unit described above, a copolymer repeating unit such as an aforementioned arylene group and heteroarylene group, and a structure represented by one of formulas (1) to (32) shown below. The repeating units represented by formulas (30) to (32) have a branch section.

<Formulas (1) to (28)>

[Chemical Formula 19]

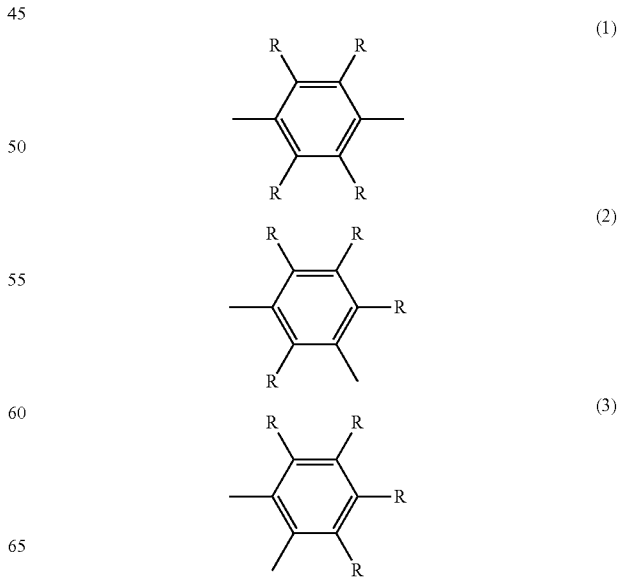

(4)
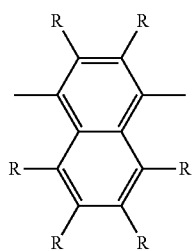
(5)
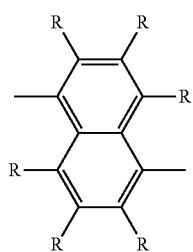
(6)
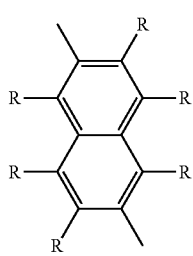
(7)
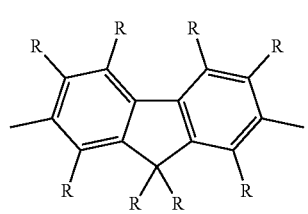
(8)
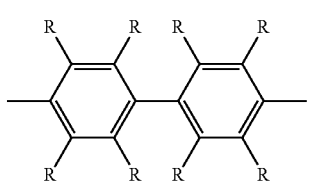
(9)
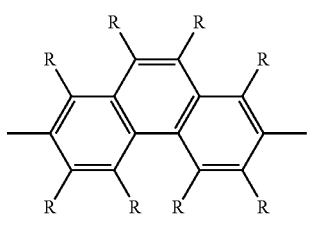
(10)
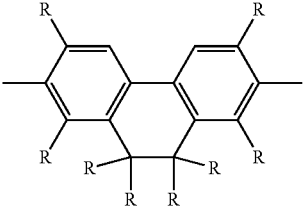
(11)
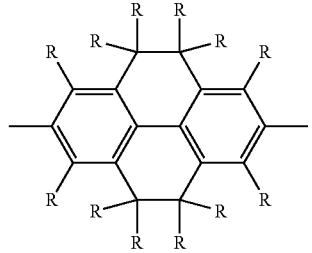
(12)
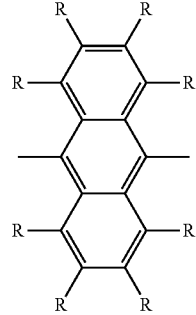
(13)
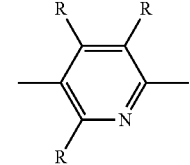
(14)
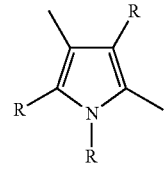
(15)
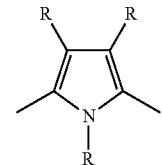
(16)
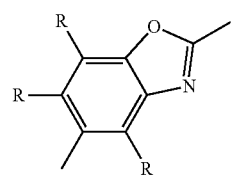
(17)
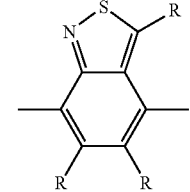

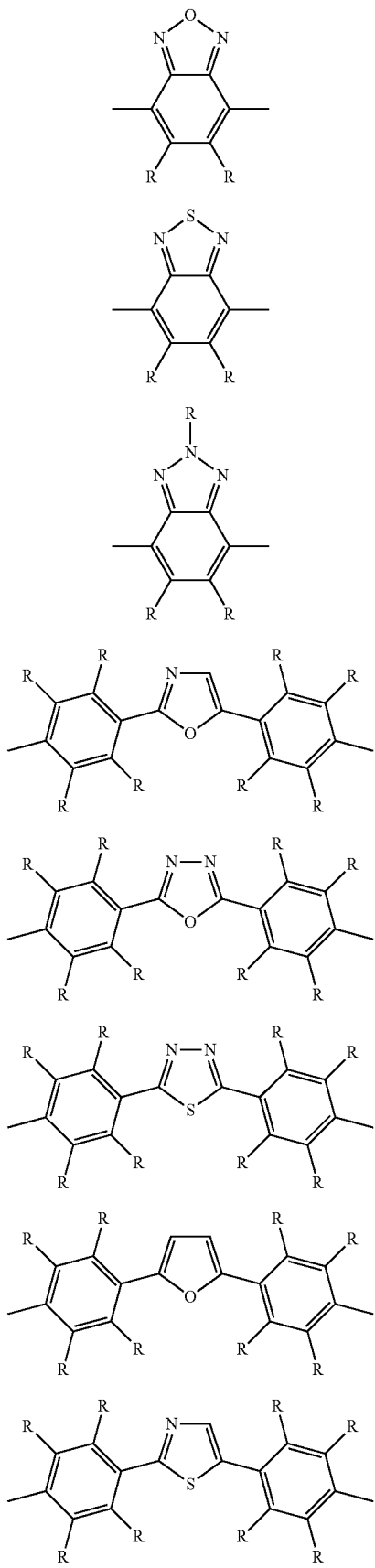

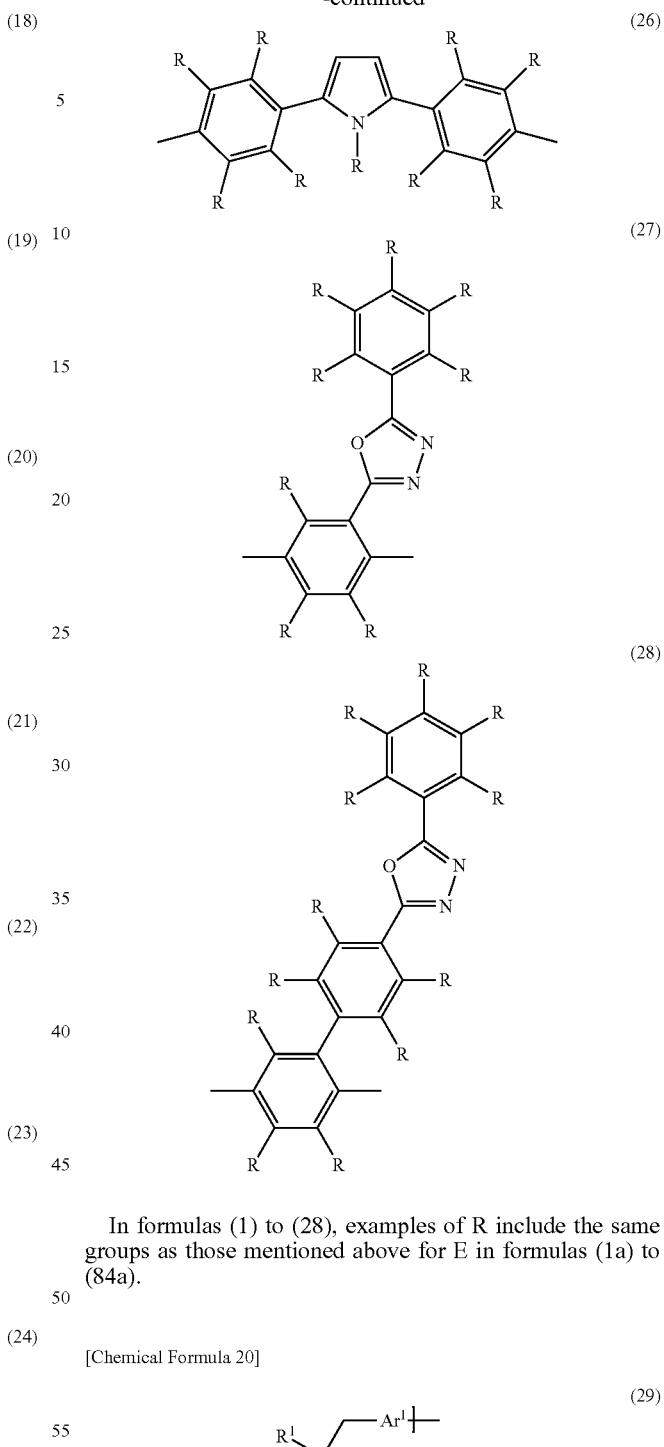

In formulas (1) to (28), examples of R include the same groups as those mentioned above for E in formulas (1a) to (84a).

[Chemical Formula 20]

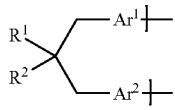
(29)

In formula (29), each of R¹ and R² is independently selected from the group consisting of a hydrogen, and substituents composed of C, H and/or X (wherein X represents a hetero atom), and each of Ar¹ and Ar² independently represents a group selected from the group consisting of divalent aromatic rings composed of C and H, and divalent aromatic rings composed of C, H and X (wherein X represents a hetero atom). R¹ and R² cannot simultaneously represent hydrogen atoms. Further, C represents a carbon atom, and H represents a hydrogen atom. Examples of X include O (an oxygen atom), N (a nitrogen atom), S (a sulfur atom), Si {a silicon atom}, and a halogen atom.

Examples of the substituent composed of C, H and/or X for $R^1$ and $R^2$ include aliphatic substituents composed of C and H, aromatic substituents composed of C and H, aromatic substituents composed of C, H and X, and other substituents {including aliphatic substituents) composed of C, H and/or X. Examples of the divalent aromatic ring composed of C and H for $Ar^1$ and $Ar^2$ include divalent aromatic hydrocarbon rings, such as monocyclic rings, and condensed rings formed by condensing 2 or more, and preferably 2 to 5 rings. Examples of the divalent aromatic rings composed of C, H and X (wherein X represents a hetero atom) include divalent heteroaromatic rings such as monocyclic heterocyclic rings, and condensed rings formed by condensing 2 or more, and preferably 2 to 5 rings. The groups for $Ar^1$ and $Ar^2$ may have a substituent.

Specific examples of $R^1$ and $R^2$ include the same groups as those mentioned above for E in formulas {1 a) to {84a). Specific examples of $Ar^1$ and $Ar^2$ include the same groups as those mentioned above for Ar in formulas (1 a) to (84a).

<Formulas (30) to (32)>

[Chemical Formula 21]

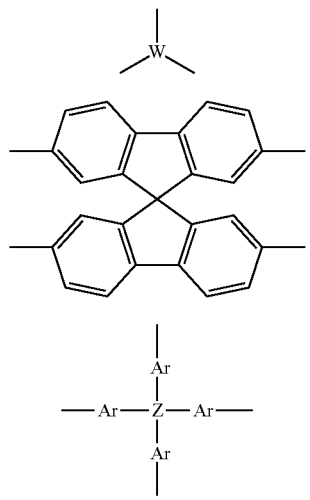

(30)

(31)

(32)

In formulas (30) to (32), W represents a trivalent linking group, and is preferably an atomic group in which one additional hydrogen atom has been removed from an arylene group or heteroarylene group of 2 to 30 carbon atoms. Each Ar independently represents an arylene group or heteroarylene group of 2 to 30 carbon atoms, and Z represents a carbon atom, a silicon atom, or a phosphorus atom. The units represented by formulas (30) to (32) may have a substituent, and examples of the substituent include the same groups as those mentioned above for E in formulas (1a) to (84a).

The polymer or oligomer (A) has a thienyl group which may have a substituent. The polymer or oligomer (A) may have the thienyl group as a substituent on a repeating unit that constitutes the main chain or a side chain, or may have the thienyl group at a terminal of the main chain or a side chain. The repeating unit that constitutes the main chain or side chain is, for example, a repeating unit represented by one of the above formulas (1 a) to (93a) or one of the formulas (1) to (32).

Examples of the thienyl group which may have a substituent include a 2-thienyl group which may have a substituent and a 3-thienyl group which may have a substituent. The thienyl group is represented, for example, by formula (Ia) or formula (Ib) shown below.

[Chemical Formula 22]

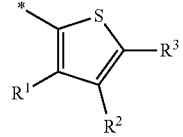

(Ia)

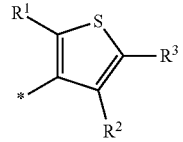

(Ib)

In formulas (Ia) and (Ib), each of $R^1$ to $R^3$ independently represents a hydrogen atom or an alkyl group, provided that at least one of $R^1$ to $R^3$ represents a hydrogen atom.

Examples of the alkyl group include linear, cyclic or branched alkyl groups of 1 to 22 carbon atoms, and a linear alkyl group is preferable. The number of carbon atoms is more preferably from 1 to 10.

Examples of the polymer or oligomer (A) having a thienyl group include polymers or oligomers having a structure represented by any of formulas (IIa) to (IIIb) shown below.

[Chemical Formula 23]

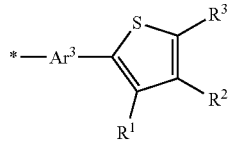

(IIa)

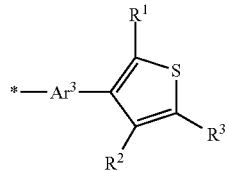

(IIb)

In formulas (IIa) and (IIb), each of $R^1$ to $R^3$ independently represents a hydrogen atom or an alkyl group, provided that at least one of $R^1$ to $R^3$ represents a hydrogen atom, and $Ar^3$ represents an arenediyl group or a heteroarenediyl group.

[Chemical Formula 24]

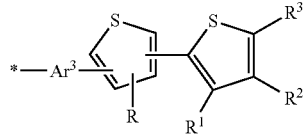

(IIa-1)

-continued

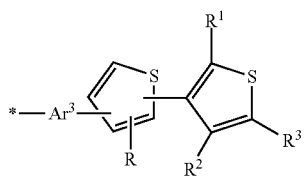
(IIb-1)

In formulas {IIa-1} and {IIb-1}, each of R and $R^1$ to $R^3$ independently represents a hydrogen atom or an alkyl group, provided that at least one of $R^1$ to $R^3$ represents a hydrogen atom, and Ar3 represents an arenediyl group or a heteroarenediyl group.

[Chemical Formula 25]

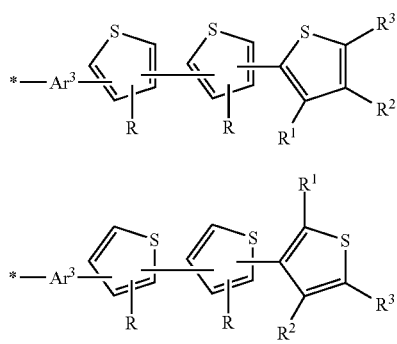
(IIa-2)

(IIb-2)

In formulas (IIa-2) and (IIb-2), each of R and $R^1$ to $R^3$ independently represents a hydrogen atom or an alkyl group, provided that at least one of $R^1$ to $R^3$ represents a hydrogen atom, and $Ar^a$ represents an arenediyl group or a heteroarenediyl group.

[Chemical Formula 26]

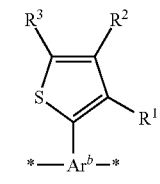
(IIIa)

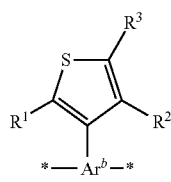
(IIIb)

In formulas (IIIa) and (IIIb), each of $R^1$ to $R^3$ independently represents a hydrogen atom or an alkyl group, provided that at least one of $R^1$ to $R^3$ represents a hydrogen atom, and $Ar^b$ represents an arenetriyl group or a heteroarenetriyl group.

Here, $Ar^a$ represents, for example, an arenediyl group or heteroarenediyl group of 2 to 30 carbon atoms. An arenediyl group is an atomic group in which 2 hydrogen atoms have been removed from an aromatic hydrocarbon, and may have a substituent, whereas a heteroarenediyl group is an atomic group in which 2 hydrogen atoms have been removed from an aromatic compound containing a hetero atom, and may have a substituent. Examples of the substituent include the same groups as those mentioned above for E in formulas (1a) to (84a).

In formulas (IIIa) and (IIIb), each of $R^1$ to $R^3$ independently represents a hydrogen atom or an alkyl group, provided that at least one of $R^1$ to $R^3$ represents a hydrogen atom, and $Ar^b$ represents an arenetriyl group or a heteroarenetriyl group.

Further, $Ar^b$ represents, for example, an arenetriyl group or heteroarenetriyl group of 2 to 30 carbon atoms. An arenetriyl group is an atomic group in which 3 hydrogen atoms have been removed from an aromatic hydrocarbon, and may have a substituent, whereas a heteroarenetriyl group is an atomic group in which 3 hydrogen atoms have been removed from an aromatic compound containing a hetero atom, and may have a substituent. Examples of the substituent include the same groups as those mentioned above for E in formulas (1a) to (84a).

Examples of the arenetriyl group include benzenetriyl, biphenyltriyl, terphenyltriyl, naphthalenetriyl, anthracenetriyl, tetracenetriyl, fluorenetriyl and phenanthrenetriyl groups. Examples of the heteroarenetriyl group include pyridinetriyl, pyrazinetriyl, quinolinetriyl, isoquinolinetriyl, acridinetriyl, phenanthrolinetriyl, furantriyl, pyrroletriyl, thiophenetriyl, carbazoletriyl, oxazoletriyl, oxad iazoletriyl, th iad iazoletriyl, triazoletriyl, benzoxazoletriyl, benzoxad iazoletriyl, benzothiadiazoletriyl, benzotriazoletriyl and benzothiophenetriyl groups Specific examples of $Ar^a$ and $Ar^b$ include Ar, and the carbazole structures and thiophene structures in formulas (1 a) to (93a); the benzene rings in formulas (85a-1) and (86a-1); the arylene groups and heteroarylene groups in formulas (1) to (28); $Ar^1$ and Ar in formula (29); W in formula (30); the fluorene structure in formula (31); and Ar in formula (32).

Specific examples of structures incorporated in the polymer or oligomer (A) are shown below. In the following formulas, n represents an integer of 1 to 22, and is preferably an integer of 1 to 10.

<Thienyl Group Set (A)>

[Chemical Formula 27]

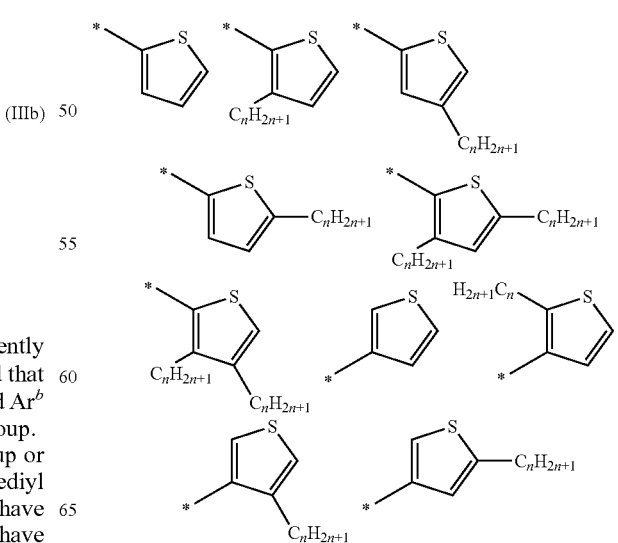

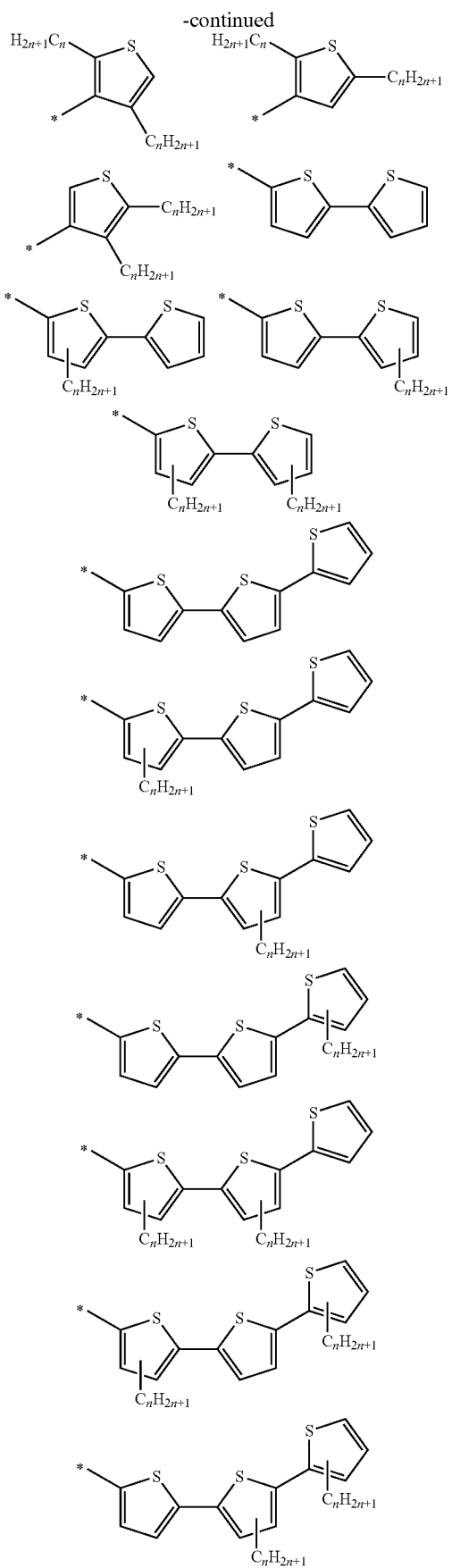
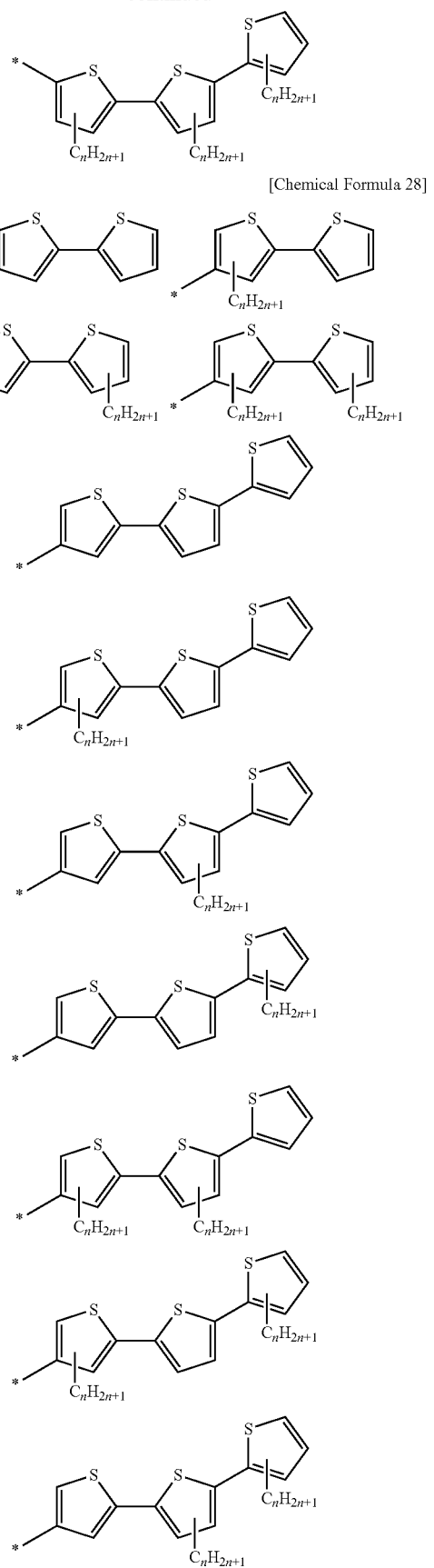
[Chemical Formula 28]

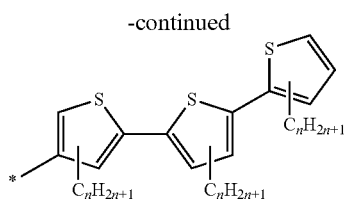

<Thienyl Group Set (B)>

[Chemical Formula 29]

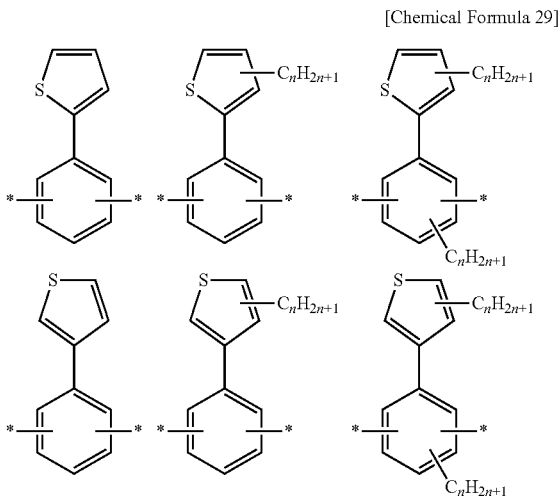

Among the above, from the viewpoints of increasing the change in solubility, reducing the effect on the energy level of the hole transport region, and enhancing the productivity and the like, the structures shown below are preferable.

[Chemical Formula 30]

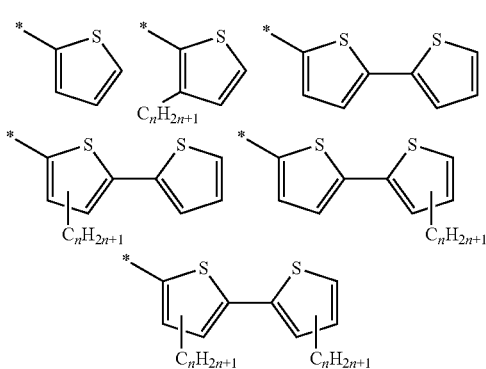

When the thienyl group is included as a substituent, the polymer or oligomer (A) may, for example, contain a repeating unit having a thienyl group. Examples of the repeating unit having a thienyl group include units represented by formulas (1a) to (14a) in which one or more of the monovalent Ar groups is a thienyl group; units represented by formulas (15a) to (84a) in which one or more of the E groups is a thienyl group; units represented by formulas (1 a) to (93a) in which Ar includes a thienyl group; units represented by formulas (1} to (28) in which one or more of the R groups is a thienyl group; units represented by formula (29) in which Ar1 and/or Ar2 include a thienyl group; and units represented by formulas (30} to (32) which include a thienyl group.

When the thienyl group exists at a terminal, the terminal may be either a main chain terminal or a side chain terminal, or may include both a main chain terminal and a side chain terminal. Further, the polymer or oligomer (A) may have a thienyl group at all the terminals, or at a portion of all the terminals. Specific examples include cases where the polymer or oligomer (A) has 2 terminals, and has a thienyl group at each of the 2 terminals, and cases where the polymer or oligomer (A) has 3 or more terminals, and has a thienyl group at 3 or more of the 3 or more terminals.

From the viewpoints of improving the properties and increasing the change in solubility of the composition, the polymer or oligomer (A) preferably has thienyl groups at the terminals, and more preferably has thienyl groups only at the terminals.

Moreover, from the viewpoint of increasing the change in solubility of the composition, the polymer or oligomer (A) preferably has a thienyl group at each of the terminals, and more preferably has 3 or more terminals, with a thienyl group at each of all of the terminals. Ensuring that the polymer or oligomer (A) has 3 or more terminals, namely ensuring the polymer or oligomer (A) has a branched structure, is also preferable from the viewpoints of increasing the weight-average molecular weight, and increasing the glass transition temperature, which contributes to an improvement in the heat resistance.

A preferred polymer or oligomer (A) has a repeating unit represented by one of formulas (85a) to (93a) and formulas (30) to (32), and has a thienyl group represented by formula (Ia) or (Ib) at the terminals. The polymer or oligomer (A) having a thienyl group represented by formula (Ia) or (Ib) at the terminals can be obtained, for example, by using a monomer corresponding with one of the aforementioned thienyl group set {A} as one of the monomers used during synthesis.

From the viewpoints of suppressing crystallization and obtaining favorable film formability, the weight-average molecular weight of the polymer or oligomer {A} is preferably 1,000 or greater, more preferably 2,000 or greater, and still more preferably 3,000 or greater. Further, from the viewpoints of improving the solubility in solvents, and facilitating the preparation of a composition containing a solvent described below, the weight-average molecular weight of the polymer or oligomer (A) is preferably 1,000,000 or less, more preferably 900,000 or less, and still more preferably 800,000 or less. The "weight-average molecular weight" describes the weight-average molecular weight measured by gel permeation chromatography (GPC) and referenced against standard polystyrenes.

More specifically, the weight-average molecular weight of the polymer or oligomer (A) is preferably from 1,000 to 1,000,000, more preferably from 2,000 to 900,000, and still more preferably from 3,000 to 800,000.

From the viewpoint of obtaining favorable film formation stability, the average number of units of repeating units in the polymer or oligomer (A) is preferably 2 or more, more preferably 5 or more, and still more preferably 10 or more. Further, from the viewpoints of ensuring a satisfactory change in the solubility of the composition, and enabling the organic layers to be formed easily, the average number of units is preferably 1,000 or fewer, more preferably 500 or fewer, and still more preferably 200 or fewer. The "average number of units of repeating units" can be determined from the weight-average molecular weight of the polymer or oligomer {A}, the molecular weight of each repeating unit, and the proportion of each repeating unit within the polymer or oligomer (A). Further, the "proportion of a repeating unit" can be determined from the blend ratio {molar ratio} of the monomer corresponding with the repeating unit used in synthesizing the polymer or oligomer (A).

More specifically, the average number of units of repeating units in the polymer or oligomer (A) is preferably from 2 to 1,000, more preferably from 5 to 500, and still more preferably from 10 to 200.

Furthermore, from the viewpoint of obtaining superior hole transport properties, the proportion of repeating units represented by formulas (1 a) to (93a) relative to all of the repeating units within the polymer or oligomer (A) is preferably 10% or greater, more preferably 25% or greater, and still more preferably 50% or greater. Further, the proportion of repeating units represented by formulas (1a) to (93a) may be set to 100%, but in consideration of introducing thienyl groups at the terminals, the proportion is preferably 95% or less, more preferably 90% or less, and still more preferably 80% or less.

More specifically, the proportion of repeating units represented by formulas (1 a) to (93a) relative to all of the repeating units within the polymer or oligomer (A) is preferably from 10 to 95%, more preferably from 25 to 90%, and still more preferably from 50 to 80%.

When the polymer or oligomer {A} has a branched structure, from the viewpoint of increasing the number of terminals and increasing the change in the solubility, the proportion of repeating units represented by formulas {85a) to (93a) and formulas (30) to (32) relative to all of the repeating units within the polymer or oligomer (A) is preferably 1% or greater, more preferably 3% or greater, and still more preferably 10% or greater. Further, from the viewpoint of preventing synthesis defects caused by gelling during synthesis of the polymer or oligomer (A), the proportion of repeating units represented by formulas (85a) to (93a) and formulas (30) to (32) is preferably 50% or less, more preferably 30% or less, and still more preferably 25% or less.

More specifically, the proportion of repeating units represented by formulas (85a) to (93a) and formulas (30) to (32) relative to all of the repeating units within the polymer or oligomer (A) is preferably from 1 to 50%, more preferably from 3 to 30%, and still more preferably from 10 to 25%.

From the viewpoint of increasing the change in solubility of the composition, the proportion of thienyl groups relative to all of the repeating units within the polymer or oligomer (A) is preferably 1% or greater, more preferably 3% or greater, and still more preferably 10% or greater. Furthermore, from the viewpoint of reducing the effect on the energy level of the hole transport region, the proportion of thienyl groups is preferably 80% or less, more preferably 60% or less, and still more preferably 40% or less. Here, the "proportion of thienyl groups" refers to the proportion of units having a structure represented by formula (Ia) or (Ib), preferably refers to the proportion of units having a structure represented by one of the thienyl group sets (A) or (B), and more preferably refers to the proportion of units having a structure represented by one of the thienyl group set (A).

More specifically, the proportion of thienyl groups relative to all of the repeating units within the polymer or oligomer (A) is preferably from 1 to 80%, more preferably from 3 to 60%, and still more preferably from 10 to 40%.

The polymer or oligomer (A) can be produced by a variety of synthesis methods known to those in the art. For example, in the case where each of the monomer units used in synthesizing the polymer or oligomer (A) has an aromatic ring, and these aromatic rings are bonded together to produce the polymer or oligomer (A), a method disclosed in T. Yamamoto et al., Bull. Chem. Soc. Jpn., Vol. 51, No. 7, page 2091 (1978), M. Zembayashi et al., Tet. Lett., Vol. 47, page 4089 (1977), or A. Suzuki, Synthetic Communications, Vol. 11, No. 7, page 513 (1981) can be used. In particular, the method disclosed by A. Suzuki is generally applicable in the production of the polymer or oligomer (A). For the monomer units, monomer units corresponding with the repeating units described above, and monomer units corresponding with the thienyl groups described above can be used.

The method disclosed by A. Suzuki causes a cross-coupling reaction between an aromatic boronic acid derivative and an aromatic halide using a Pd catalyst (typically called the "Suzuki Reaction"). By performing a coupling reaction between desired aromatic rings, the polymer or oligomer (A) can be produced.

Further in the Suzuki Reaction, a soluble Pd compound in the form of a Pd(II) salt or a Pd(0) complex is generally used as the Pd catalyst. For example, Pd(Ph$_3$P)$_4$, a complex of a tertiary phosphine ligand with Pd(OAc)$_2$ a Pd$_2$(dba)$_3$ complex or a PdCl$_2$(dppf) complex in an amount of 0.01 to 5 mol % relative to the aromatic reactants are ideal Pd sources.

A base is also generally used in this reaction, and preferred bases include water-soluble alkaline carbonates and bicarbonates, and tetraalkylammonium hydroxides. Further, the reaction can also be accelerated in nonpolar solvents using a phase transfer catalyst. Examples of solvents which may be used include N,N-dimethylformamide, toluene, anisole, dimethoxyethane and tetrahydrofuran.

[Initiator (B)]

The initiator (B) is used for changing the solubility of the composition. Substances which can act as an oxidizing agent within the composition can be used as the initiator (B). From the viewpoint of improving the hole transport properties, the use of a substance which can act as an oxidizing agent relative to the polymer or oligomer (A) is preferable. From the viewpoint of the change in solubility of the composition, an onium salt composed of a cation and an anion is preferred as the initiator (B), and details of this onium salt are described below.

[Cation]

Examples of the cation include H+a carbenium ion, ammonium ion, anilinium ion, pyridinium ion, imidazolium ion, pyrrolidinium ion, quinolinium ion, imonium ion, aminium ion, oxonium ion, pyrylium ion, chromenylium ion, xanthylium ion, iodonium ion, sulfonium ion, phosphonium ion, tropylium ion and cations having a transition metal, and of these, a carbenium ion, ammonium ion, anilinium ion, aminium ion, iodonium ion, sulfonium ion or tropylium ion is preferable. From the viewpoint of achieving a favorable combination of changeability of the solubility of the composition and storage stability, an ammonium ion, anilinium ion, iodonium ion or sulfonium ion is more preferable.

[Anion]

Examples of the anion include halide ions such as F$^-$, Cl$^-$, Br$^-$ and I$^-$; OH$^-$; ClO$_4^-$; sulfonate ions such as FSO$_3^-$, ClSO$_3^-$, CH$_3$SO$_3^-$, C$_6$H$_5$SO$_3^-$ and CF$_3$SO$_3^-$; sulfate ions such as HSO$_4^-$ and SO$_4^{2-}$; carbonate ions such as HCO$_3^-$ and CO$_3^{2-}$; phosphate ions such as H$_2$PO$_4$, HPO$_4^{2-}$ and PO$_4^{3-}$; fluorophosphate ions such as PF6- and PF50H—; fluoroalkyl fluorophosphate ions such as [(CF$_3$CF$_2$)$_3$PF$_3$]$^-$, [(CF$_3$CF$_2$CF$_2$)$_3$PF$_3$]$^-$, [((CF$_3$)$_2$CF)$_3$PF$_3$]$^-$, [((CF$_3$)$_2$CF)$_2$PF$_4$]$^-$, [((CF$_3$)$_2$CFCF$_2$)$_3$PF$_3$]$^-$ and [((CF$_3$)$_2$CFCF$_2$)$_2$PF$_4$]$^-$ fluoroalkane sulfonyl methide or imide ions such as $(CF_3SO_2)_3C^-$ and $(CF_3SO_2)_2N^-$; borate ions such as $BF_4^-$, $B(C_6F_5)_4^-$ and $B(C_6H_4CF_3)_4^-$; fluoroantimonate ions such as $SbF_6^-$ and $SbF_5OH^-$; fluoroarsenate ions such as $AsF_6^-$ and $AsF_5OH^-$; $AlCl_4^-$ and $BiF_6^-$. From the viewpoint of the changeability of the solubility of the composition when used in combination with the aforementioned cation, fluorophosphate ions such as $PF_6^-$ and $PF_5OH^-$; fluoroalkyl fluorophosphate ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$ and $[((CF_3)_2CFCF_2)_2PF_4]^-$; fluoroalkane sulfonyl methide or imide ions such as $(CF_3SO_2)_3C^-$ and $(CF_3SO_2)_2N^-$; borate ions such as $BF_4^-$, $B(C_8F_5)_4^-$ and $B(C_6H_4CF_3)_4^-$; and fluoroantimonate ions such as $SbF_6^-$ and $SbF_6OH^-$ are preferable, and among these, a borate ion is particularly preferable.

More specifically, an initiator containing one cation selected from among an ammonium ion, anilinium ion, iodonium ion and sulfonium ion, and one anion selected from among fluorophosphate ions, fluoroalkyl fluorophosphate ions, fluoroalkane sulfonyl methide or imide ions, borate ions and fluoroantimonate ions is preferable. Specific examples of the anion and cation incorporated within this preferred initiator are not limited to those mentioned above, and conventional anions and cations can be used.

From the viewpoint of changing the solubility of the composition and enabling multilayering to be performed easily, the amount of the initiator (B) relative to the weight of the polymer or oligomer (A) is preferably 0.1% by weight or greater, more preferably 0.2% by weight or greater, and still more preferably 0.5% by weight or greater. Further, from the viewpoint of preventing any deterioration in the element properties caused by residual substances derived from the initiator (B) remaining in the organic layer, the amount of the initiator (B) is preferably 30% by weight or less, more preferably 25% by weight or less, and still more preferably 20% by weight or less. Examples of substances derived from the initiator (B) include the initiator (B) itself, and decomposition or reaction products of the initiator {B).

More specifically, the amount of the initiator (B), relative to the weight of the polymer or oligomer (A), is preferably within a range from 0.1 to 30% by weight, more preferably within a range from 0.2 to 25% by weight, and particularly preferably within a range from 0.5 to 20% by weight.

The solubility of the composition can be changed by light irradiation and/or heating, and as a result, multilayering can be achieved by application using the same kind of solvent. For example, light with a wavelength of 200 to 800 nm can be used for the light irradiation. Further, the heating temperature is preferably from 60 to 300° C., more preferably from 80 to 250° C., and still more preferably from 100 to 220° C. The heating time is preferably from 10 seconds to 2 hours, more preferably from 1 minute to 1 hour, and still more preferably from 1 to 10 minutes.

[Solvent (C)]

The composition capable of changing its solubility may also contain a solvent. Any solvent which enables the composition to be used in forming a coating layer can be used as the solvent, and the use of a solvent capable of dissolving the polymer or oligomer (A) and the initiator (B) is preferable.

Examples of the solvent include water; alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol 1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; and dimethylsulfoxide, tetrahydrofuran, acetone, chloroform and methylene chloride. Preferred solvents include aromatic hydrocarbons, aliphatic esters, aromatic esters, aliphatic ethers and aromatic ethers.

The amount of the solvent in the composition can be determined with due consideration of the applicability to various coating methods. For example, the amount of solvent is preferably an amount that yields a ratio of the polymer or oligomer (A) relative to the solvent of 0.1% by weight or greater, more preferably 0.2% by weight or greater, and still more preferably 0.5% by weight or greater. Further, the amount of solvent is preferably an amount that yields a ratio of the polymer or oligomer (A) relative to the solvent of 10% by weight or less, more preferably 5% by weight or less, and still more preferably 3% by weight or less.

More specifically, the amount of the solvent in the composition is an amount that yields a ratio of the polymer or oligomer (A) relative to the solvent that is preferably from 0.1 to 10% by weight, more preferably from 0.2 to 5% by weight, and still more preferably from 0.5 to 3% by weight.

The mechanism by which the solubility of the composition changes is not entirely clear, but in one example of the mechanism, it is thought that a bond is formed between thienyl groups, for example by the thienyl groups forming a covalent bond under the actions of light and/or heat and the initiator, thereby changing the solubility of the composition. The polymer or oligomer (A) may also have a group that forms a bond such as a carbon-carbon double bond-containing group or a group having a small ring, but from the viewpoint of improving the properties of the element, the polymer or oligomer (A) need not have any groups that are capable of forming bonds besides the thienyl groups. Because the composition undergoes a change in solubility, in one embodiment, the composition can be used as a curable resin composition.

In order to enable multilayering of the organic layers, it is preferable that the degree of change in the solubility of the composition in the solvent is as large as possible. A "capability of changing the solubility of the composition" can be confirmed by whether or not the solubility in solvent of an organic layer formed using the composition changes upon application of light and/or heat. Specifically, first, an organic layer (1) is formed by a coating method using a composition containing the polymer or oligomer (A), the initiator (B) and a solvent (1). Following an optional drying step, light and/or heat is applied to the organic layer (1) to obtain an organic layer (2). Subsequently, the organic layer (2) is brought into contact with a solvent (2) to obtain an organic layer (3). The greater the thickness of the obtained organic layer (3), the greater the degree of change in the solubility of that composition. In other words, the ratio of the thickness of the organic layer (3) relative to the thickness of the organic layer (2) (namely, the organic layer residual ratio) is preferably large. More specifically, the residual ratio is preferably 50% or greater, more preferably 80% or greater, and still more preferably 90% or greater. The residual ratio can be determined from the ratio between the measured thickness values of the organic layer (2) and the organic layer (3), or from the ratio between the measured absorbance values of the organic layer (2) and the organic layer (3).

At this time, the thickness of the organic layer (2) is preferably set within the same range as the thickness of the organic layer according to an embodiment of the present invention described below. Further, for the solvent (2), the same solvent as the solvent (1) can be used, in the case where the solvent (1) is a mixed solvent, the solvent having the largest weight ratio within the solvent (1) can be used, or toluene can be used. Regardless of whether the solvent (1), the solvent having the largest weight ratio within the solvent (1), or toluene is used as the solvent (2) in the above confirmation, the thickness of the organic layer (3) is preferably at least as large as the aforementioned limit. Confirmation using either the solvent having the largest weight ratio within the solvent (1) or toluene is relatively simple, and performing the confirmation using toluene is particularly simple.

As described above, the composition capable of changing its solubility contains the polymer or oligomer (A) having a repeating unit with hole transport properties, and can therefore be used favorably as a hole transport material composition used in the formation of organic electronic elements such as organic EL elements and organic photoelectric conversion elements.

[Hole Transport Material Composition]

Further, another embodiment of the present invention relates to a hole transport material composition containing the above composition.

The hole transport material composition contains the polymer or oligomer (A), the initiator (B), and generally a solvent that can dissolve or disperse these components. Examples of the solvent are the same as mentioned above. The hole transport material composition may also contain a low-molecular weight compound or a substance that can act as a dopant or the like.

[Ink Composition]

Furthermore, yet another embodiment of the present invention relates to an ink composition containing the above composition.

The ink composition contains the polymer or oligomer (A), the initiator (B), and generally a solvent that can dissolve or disperse these components. Examples of the solvent are the same as mentioned above. The ink composition may also contain other additives such as a polymerization inhibitor, stabilizer, thickener, gelling agent, flame retardant, antioxidant, reduction inhibitor, oxidizing agent, reducing agent, surface improver, emulsifier, antifoaming agent, dispersant or surfactant.

[Organic Layer]

Further, yet another embodiment of the present invention relates to organic layers (I) and (II) formed from the aforementioned composition capable of changing its solubility, hole transport material composition or ink composition (hereafter, the organic layer (I) and/or organic layer (II) is also referred to as simply "the organic layer"). The organic layer (I) can be formed by applying one of these compositions.

Examples of the coating method include conventional methods such as inkjet methods, casting methods, dipping methods, printing methods such as relief printing, intaglio printing, offset printing, lithographic printing, letterpress inversion offset printing, screen printing and gravure printing, and spin coating methods. The application is typically performed at a temperature within a range from −20 to +300° C., preferably from 1 O to 100° C., and particularly preferably from 15 to 50° C. Further, following application, the obtained organic layer (I) may be dried on a hotplate or in an oven to remove the solvent, typically at a temperature within a range from +30 to +300° C., preferably from 60 to 250° C., and particularly preferably from 80 to 220° C. The drying time is typically from 10 seconds to 2 hours, preferably from 1 minute to 1 hour, and particularly preferably from 1 to 10 minutes.

By applying heat, light, or both heat and light to the organic layer (I} formed by coating, an organic layer (II) can be obtained that has a different solubility from that prior to the application of heat and/or light. The conditions for the application of light and/or heat (the light irradiation conditions and/or heating conditions) are as described above. Because the organic layer (II) has low solubility in solvents, a separate organic layer can easily be formed on top of the organic layer (II} using a coating solution. The solvent contained within the coating solution used in forming the separate organic layer is not limited to the solvent (2) mentioned above.

For the light irradiation, light sources such as a low-pressure mercury lamp, medium-pressure mercury lamp, high-pressure mercury lamp, ultra high-pressure mercury lamp, metal halide lamp, xenon lamp, fluorescent lamp, light-emitting diode or sunlight can be used, whereas the heating can be performed on a hotplate or in an oven.

The thickness of the organic layer can be set appropriately in accordance with the intended use. For example, the thickness can be set within a range from 5 nm to 10 μm. Particularly in those cases when the organic layer is used for the hole injection layer and/or hole transport layer of an organic EL element, from the viewpoint of moderating surface roughness of the anode and reducing the chance of short-circuits, the thickness of the organic layer both before and after the change in solubility is preferably 5 nm or greater, more preferably 10 nm or greater, and still more preferably 20 nm or greater. Further, from the viewpoint of reducing the drive voltage of the organic EL element, the thickness of the organic layer is preferably 500 nm or less, more preferably 200 nm or less, and still more preferably 100 nm or less. Specifically, the thickness is preferably from 5 to 500 nm, more preferably from 10 to 200 nm, and still more preferably from 20 to 100 nm.

[Organic Electronic Element, Display Element, Illumination Device]

Further, other embodiments of the present invention relate to organic electronic elements such as an organic EL element and an organic photoelectric conversion element having the aforementioned organic layer. The organic electronic element contains at least two electrodes, and the organic layer positioned between the electrodes.

Moreover, yet other embodiments of the present invention relate to a display element and an illumination device which use the organic EL element.

[Organic EL Element]

The organic EL element according to one embodiment of the present invention contains the aforementioned organic layer. The organic EL element typically contains a light-emitting layer, an anode, a cathode and a substrate, and may also contain other layers such as a hole injection layer, an electron injection layer, a hole transport layer and an electron transport layer. The organic EL element has at least the aforementioned organic layer, and for example, the organic layer can be used as the light-emitting layer and as other layers, and is preferably used as the hole injection layer and/or the hole transport layer. Accordingly, one example of the organic EL element has, in sequence, an anode, the organic layer as a hole injection layer and/or a hole transport layer, a light-emitting layer and a cathode, and may also include other optional layers between these layers. Each layer is described below in further detail.

[Light-Emitting Layer]

The material used for the light-emitting layer may be a low-molecular weight compound, a polymer or an oligomer, and a dendrimer or the like may also be used. Examples of low-molecular weight compounds that utilize fluorescence include perylene, coumarin, rubrene, quinacridone, dyes for dye lasers (such as rhodamine and DCM1), aluminum complexes (such as tris(8-hydroxyquinolinato)aluminum (III) ($Alq_3$)), stilbene, and derivatives of these compounds. Examples of polymers or oligomers that utilize fluorescence include polyfluorene, polyphenylene, polyphenylene vinylene (PPV), polyvinylcarbazole (PVK), fluorene-benzothiadiazole copolymers, fluorene-triphenylamine copolymers, and derivatives and mixtures and the like thereof.

On the other hand, in recent years, the development of phosphorescent organic EL elements is also being actively pursued, with the aim of increasing the efficiency of organic EL elements. In a phosphorescent organic EL element, not only the energy from a singlet state, but also the energy from a triplet state can be utilized, and the internal quantum yield can be raised to 100% in principle. In a phosphorescent organic EL element, a metal complex-based phosphorescent material containing a heavy metal such as platinum or iridium is used as a phosphorescence-generating dopant for doping the host material, thus enabling the extraction of phosphorescent emission (see M. A. Baldo et al., Nature, vol. 395, page 151 (1998), M. A. Baldo et al., Applied Physics Letters, vol. 75, page 4 (1999), and M. A. Baldo et al., Nature, vol. 403, page 750 (2000)).

Similarly, in the organic EL element that represents an embodiment of the present invention, a phosphorescent material can be used for the light-emitting layer from the viewpoint of improving the efficiency. Metal complexes and the like containing a central metal such as Ir or Pt can be used favorably as the phosphorescent material. Specific examples of Ir complexes include FIr(pic) [iridium(III) bis[(4,6-difluorophenyl)-pyridinato-$N,C^2$]picolinate] which emits blue light, $Ir(ppy)_3$ [fac tris(2-phenylpyridine)iridium] (see the aforementioned M. A. Baldo et al., Nature, vol. 403, page 750 (2000)) which emits green light, and $(btp)_2Ir(acac)$ {bis[2-(2'-benzo[4,5-α]thienyl)pyridinato-$N,C^3$]iridium (acetyl acetonate)} (see Adachi et al., Appl. Phys. Lett., 78 No. 11, 2001, 1622) or $Ir(piq)_3$ [tris(1-phenylisoquinoline)iridium] which emit red light. A specific example of a Pt complex is 2,3,7,8,12,13,17,18-octaethyl-21H,23H-porphine platinum {PtOEP} which emits red light. A low-molecular weight material or a dendrite such as an iridium core dendrimer can be used as the phosphorescent material. Further, derivatives of these compounds can also be used.

Further, when the light-emitting layer contains a phosphorescent material, the layer preferably contains a host material besides the phosphorescent material. The host material may be a low-molecular weight compound, a polymer or oligomer, or a dendrimer or the like.

Examples of compounds that can be used as the low-molecular weight compound include CBP (4,4'-bis(carbazol-9-yl)-biphenyl), mCP (1,3-bis(9-carboazolyl)benzene), CDBP (4,4'-bis(carbzol-9-yl)-2,2'-dimethylbiphenyl), and αNPD (4,4'-bis[(1-naphthyl)phenylamino]-1,1'-biphenyl}. Examples of the polymer or oligomer include polyvinylcarbazole, polyphenylene and polyfluorene, and derivatives of these compounds can also be used.

The light-emitting layer may be formed by a vapor deposition method or a coating method. In the case of formation by a coating method, the organic EL element can be produced inexpensively, which is preferable. In order to form the light-emitting layer by a coating method, a solution containing the phosphorescent material, and where necessary a host material, can be applied to a desired substrate using a conventional coating method. Examples of the coating method include inkjet methods, casting methods, dipping methods, printing methods such as relief printing, intaglio printing, offset printing, lithographic printing, letterpress inversion offset printing, screen printing and gravure printing, and spin coating methods.

[Cathode]

The cathode material is preferably a metal or metal alloy such as Li, Ca, Mg, Al, In, Cs, Ba, Mg/Ag, LiF and CsF.

[Anode]

A metal (for example, Au) or another material having metal-like conductivity can be used as the anode. Examples of the other materials include oxides (for example, ITO: indium oxide/tin oxide) and conductive polymers (for example, polythiophene-polystyrene sulfonic acid mixtures (PEDOT:PSS)).

[Electron Transport Layer, Electron Injection Layer]

Examples of the electron transport layer and electron injection layer include phenanthroline derivatives (for example, 2,9-dimethyl-4,7-diphenyl-1,10-phenathroline (BCP)), bipyridine derivatives, nitro-substituted fluorene derivatives, diphenylquinone derivatives, thiopyran dioxide derivatives, naphthalene, condensed ring tetracarboxylic anhydrides such as perylene, carbodiimide, fluorenylidine methane derivatives, anthraquinodimethane and anthrone derivatives, oxadiazole derivatives (for example, 2-(4-biphenylyl)-5-(4-tert-butylphenyl-1,3,4-oxadiazole) (PBD)), and aluminum complexes (for example, tris(8-hydroxyquinolinato)aluminum (III) (Alq3) and bis(2-methyl-8-quinolinato)-4-phenylphenolate aluminum(!! I) (BAlq)). Moreover, thiadiazole derivatives in which the oxygen atom in the oxadiazole ring of the aforementioned oxadiazole complexes has been substituted with a sulfur atom, and quinoxaline derivatives having a quinoxaline ring, which are known as electron-withdrawing groups, can also be used.

[Substrate]

There are no particular limitations on the types of glass and plastic and the like that can be used as the substrate for the organic EL element. Further, a transparent substrate is preferable, and glass, quartz, and optically transparent resin films and the like can be used favorably. When a resin film is used, the organic EL element can be imparted with flexibility (namely, a flexible substrate), which is particularly desirable.

Examples of the resin film include films formed from polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC) and cellulose acetate propionate (CAP).

Further, when a resin film is used, in order to prevent the permeation of water vapor and oxygen and the like, the resin film may be coated with an inorganic substance such as silicon oxide or silicon nitride prior to use.

[Sealing]

The organic EL element that represents an embodiment of the present invention may be sealed using the same methods as those described below for the photoelectric conversion element in order to reduce the effect of the external atmosphere and extend the lifetime of the element.

[Emission Color]

There are no particular limitations on the emission color from the organic EL element, but a white light-emitting element can be used for various illumination devices such as household illumination, in-vehicle illumination, and clocks or liquid crystal backlights, and is consequently preferred.

Currently, achieving white light emission with a single material is difficult, and therefore the method of forming a white light-emitting element typically involves using a plurality of light-emitting materials to simultaneously emit a plurality of light colors, and then mixing these colors to obtain a white light emission. There are no particular limitations on the plurality of emission colors which are combined, and examples include combinations containing 3 maximum emission wavelengths of blue, green and red, and combinations containing 2 maximum emission wavelengths that utilize a complementary color relationship, such as blue and yellow, or yellow-green and orange. Furthermore, the emission color can be controlled by altering the type and amount of the phosphorescent material.

[Display Element, Illumination Device, Display Device]

A display element that represents one embodiment of the present invention includes the organic EL element described above.

For example, by using an aforementioned organic EL element as the element corresponding with each pixel of red-green-blue (RGB}, a color display element can be obtained.

Image formation systems include simple matrix type systems in which the organic EL elements arranged in the panel are driven directly by electrodes disposed in a matrix arrangement, and active matrix type systems in which a thin-film transistor is provided and driven in each element. The former type has a simple structure, but there is a limit to the number of vertical pixels, and therefore this type of system is typically used for displaying text or the like. The latter type has a low drive voltage, requires minimal current, and yields bright and very detailed images, and is therefore used for high-quality displays.

Furthermore, an illumination device that represents one embodiment of the present invention includes the organic EL element described above. Moreover, a display device that represents another embodiment of the present invention includes the illumination device, and a liquid crystal element as a display means. A display device in which the aforementioned illumination device is used as the backlight (white light emission source}, and a liquid crystal element is used as the display means, namely a liquid crystal display device may also be formed. This configuration is merely a conventional liquid crystal display device in which only the backlight has been replaced with the aforementioned illumination device, and the liquid crystal element section can employ conventional technology.

[Organic Photoelectric Conversion Element]

Organic photoelectric conversion elements include organic solar cells and organic optical sensors, and typically contain a photoelectric conversion layer, electrodes and a substrate. Moreover, for the purpose of improving the conversion efficiency or the stability within air, the organic photoelectric conversion element may further contain one or more other layers such as a buffer layer or electron transport layer. The organic photoelectric conversion element contains at least the organic layer described above, wherein the organic layer can be used as the photoelectric conversion layer or a buffer layer, and is preferably used as a buffer layer. Accordingly, one example of the organic photoelectric conversion element has, in sequence, an anode, the organic layer as a buffer layer, a photoelectric conversion layer, and a cathode, and may include other optional layers between these layers. The structure of the organic photoelectric conversion element is described below in further detail.

[Photoelectric Conversion Layer]

Any material that absorbs light, causes a charge separation, and generates an electromotive force can be used for the photoelectric conversion layer. In particular, from the viewpoint of conversion efficiency, a mixture obtained by blending a p-type organic semiconductor and an n-type organic semiconductor is preferable.

Examples of materials that can be used favorably as the p-type organic semiconductor include polymers or oligomers such as oligothiophene, polyalkylthiophene, poly(3-hexylthiophene) (P3HT) and polyphenylene vinylene (PPV); porphyrin, phthalocyanine and copper phthalocyanine; and derivatives of these compounds.

Examples of materials that can be used favorably as the n-type organic semiconductor include —CN group-containing or —$CF_3$ group-containing polymers or oligomers such as CN-poly(phenylene-vinylene) (CN-PPV), MEH-CN-PPV, and —$CF_3$ substituted polymers thereof; polymers or oligomers such as poly(fluorene) derivatives and fluorene-benzothiadiazole copolymers; fullerene ($C_{60}$), [6,6]-phenyl-$C_{61}$-butyric acid methyl ester (PCBM), [6,6]-phenyl-C71-butyric acid methyl ester (PCBM), naphthalene tetracarboxylic dianhydride (NTCDA), perylene tetracarboxylic dianhydride (PTCDA), naphthalene tetracarboxylic diimide, perylene tetracarboxylic diimide, quinacridone; and derivatives of these compounds.

There are no particular limitations on the method used for forming the photoelectric conversion layer, and the layer may be formed by a vapor deposition method or a coating method. When the photoelectric conversion layer is formed by a coating method, the organic photoelectric conversion element can be produced inexpensively, which is preferable. Examples of methods that can be used for forming the layer by a coating method include the same methods as those mentioned above for forming the light-emitting layer.

[Other Layers]

Besides the photoelectric conversion layer, the organic photoelectric conversion element has a buffer layer as mentioned above, and may also contain an electron transport layer or the like. The organic layer described above can be used as the buffer layer, and UF, TiOx or ZnOx or the like is generally used for the electron transport layer.

[Electrodes]

Any material that exhibits conductivity can be used as the electrodes. Examples of materials for the electrodes include metals such as platinum, gold, silver, aluminum, chromium, nickel, copper, titanium, magnesium, calcium, barium, sodium and lithium fluoride, or alloys or salts of these metals; metal oxides such as indium oxide and tin oxide, or an alloy thereof (ITO); conductive polymers such as polyaniline, polypyrrole, polythiophene and polyacetylene; the above conductive polymers containing an added dopant, including an acid such as hydrochloric acid, sulfuric acid or sulfonic acid, a Lewis acid such as FeCb, halogen atoms such as iodine, or metal atoms such as sodium or potassium; and conductive composite materials in which conductive particles such as metal particles, carbon black, fullerene or carbon nanotubes are dispersed within a matrix such as a polymer binder. A combination of these materials may also be used.

Further, at least one pair of (two) electrodes is provided, and at least one of the electrodes is a transparent electrode. Examples of the transparent electrode include oxides such as indium tin oxide (ITO), and indium zinc oxide (IZO); metal thin films; and conductive polymers such as PEDOT:PSS.

The electrodes have the function of collecting the holes and electrons generated inside the photoelectric conversion layer, and the use of a pair of electrode materials that are appropriate for collecting holes and electrons respectively is preferable. Examples of electrode materials that are appropriate for collecting holes include materials having a high work function such as Au and ITO. On the other hand, examples of electrode materials that are appropriate for collecting electrons include materials having a low work function such as Al.

There are no particular limitations on the method used for forming the electrodes, and for example, methods such as vacuum deposition, sputtering and coating methods can be used.

[Substrate]

Any material that is capable of supporting each of the layers can be used as the substrate. Examples of the material for the substrate include inorganic materials such as glass; organic materials such as polyethylene terephthalate (PET), polyethylene naphthalate (PEN), polyethersulfone (PES), polyimide (PI), polyetherimide (PEI), cycloolefin polymer (COP), polyphenylene sulfide (PPS), nylon, polystyrene, polyethylene, polypropylene, polyvinyl alcohol, fluororesin, polyvinyl chloride, cellulose, polyvinylidene chloride, aramid, polyurethane, polycarbonate, polyarylate, polynorbornene and polylactic acid; and composite materials including metals such as stainless steel, titanium or aluminum which have been surface-coated or laminated in order to impart insulating properties. Further, in order to impart gas barrier properties, a substrate that has been laminated with an inorganic substance such as silicon oxide or silicone nitride may also be used.

In particular, films formed from organic materials such as PET, PEN, PES, PI, PEI, COP and PPS provide good transparency and flexibility, and are consequently preferred.

[Sealing]

The organic photoelectric conversion element that represents an embodiment of the present invention may be sealed in order to reduce the effect of the external atmosphere and extend the lifetime of the element. Examples of materials that can be used for the sealing include glass, plastic films such as epoxy resin, acrylic resin, PET and PEN, and inorganic substances such as silicon oxide and silicon nitride.

There are no particular limitations on the sealing method, and examples of methods that can be used include a method in which the sealing material is formed directly on the organic photoelectric conversion element by vacuum deposition, sputtering or a coating method or the like, and a method in which glass or a plastic film is affixed to the organic photoelectric conversion element using an adhesive.

EXAMPLES

The embodiments of the present invention are described below based on a series of examples, but the present invention is in no way limited by these examples.

<Synthesis of Polymers>

(Preparation of Pd Catalyst)

In a glove box under a nitrogen atmosphere and at room temperature, tris(dibenzylideneacetone)dipalladium (73.2 mg, 80 μmol) was weighed into a sample tube, anisole (15 mL) was added, and stirring was performed for 30 minutes. Similarly, tri-tert-butylphosphine (129.6 mg, 640 μmol) was weighed into a sample tube, anisole (5 mL) was added, and stirring was performed for 5 minutes. These solutions were then mixed, and stirred at room temperature for 30 minutes to form a catalyst. All solvents were deaerated by nitrogen bubbling for at least 30 minutes prior to use.

Synthesis Example 1

[Chemical Formula 31]

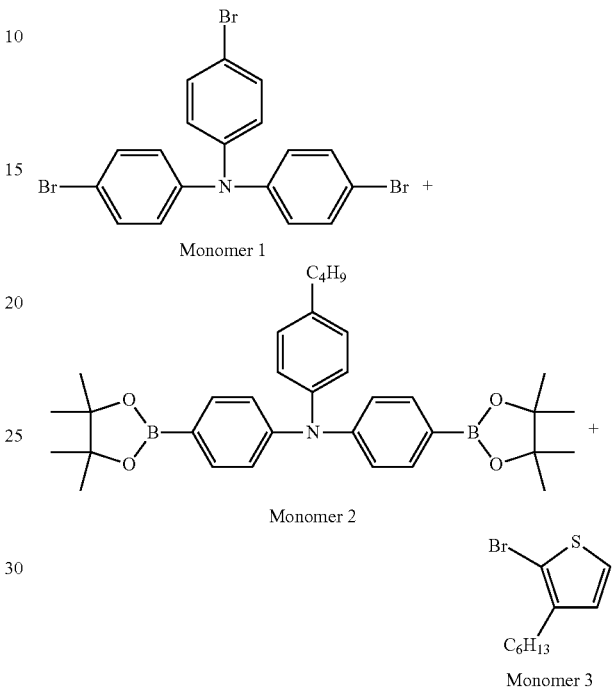

A three-neck round-bottom flask was charged with the monomer 1 (1.0 mmol), the monomer 2 (2.5 mmol), the monomer 3 (2.0 mmol) and anisole (20 mL), and the prepared Pd catalyst solution (1.0 mL) was then added. Following stirring of the mixture for 30 minutes, a 10% aqueous solution of tetraethylammonium hydroxide (12 mL) was added. All solvents were deaerated by nitrogen bubbling for at least 30 minutes prior to use. The resulting mixture was heated and refluxed for 2 hours. All operations up until this point were conducted under a stream of nitrogen.

Following completion of the reaction, the organic layer was washed with water, and the organic layer was then poured into methanol-water (9:1). The precipitate that was produced was collected by suction filtration, and washed with methanol-water (9:1). The thus obtained precipitate was dissolved in toluene, and then reprecipitated from methanol. The thus obtained precipitate was collected by suction filtration and dissolved in toluene, and triphenylphosphine, polymer-bound on styrene-divinylbenzene copolymer (manufactured by Strem Chemicals Inc., 200 mg per 100 mg of polymer, hereafter referred to as "the metal adsorbent") was then added to the solution and stirred overnight. Following completion of the stirring, the metal adsorbent and any insoluble matter was removed by filtration, and the filtrate was concentrated using a rotary evaporator. The resulting concentrate was dissolved in toluene, and then reprecipitated from methanol-acetone (8:3). The produced precipitate was collected by suction filtration, and washed with methanol-acetone (8:3). The thus obtained precipitate was dried under vacuum to obtain a polymer A having thiophene rings at the terminals. The molecular weight was measured by GPC (relative to polystyrene standards) using tetrahydrofuran (THF) as the eluent. The weight-average molecular weight was 42,000, and the yield was 38%. The polymer A had units of formula (87a) (corresponding with the monomer 1), formula (1a) (corresponding with the monomer 2), and the thienyl group set (A) (corresponding with the monomer 3), and the relative proportions of those units were 18.2%, 45.5% and 36.4% respectively. Further, the average numbers of units of formula (87a), formula (1a), and the thienyl group set (A) were 32, 79 and 63 respectively.

The measurement conditions for the weight-average molecular weight were as follows.

Feed pump: L-6050, manufactured by Hitachi High-Technologies Corporation

UV-Vis detector: L-3000, manufactured by Hitachi High-Technologies Corporation

Column: Gelpack (R) GL-A160S I GL-A150S, manufactured by Hitachi Chemical Co., Ltd.

Eluent: THF (manufactured by Wako Pure Chemical Industries, Ltd., for HPLC, stabilizer-free)

Flow rate: 1 ml/min

Column temperature: room temperature

Molecular weight standards: standard polystyrenes

Synthesis Example 2

Polymer B Having Bithiophene at Terminals

[Chemical Formula 32]

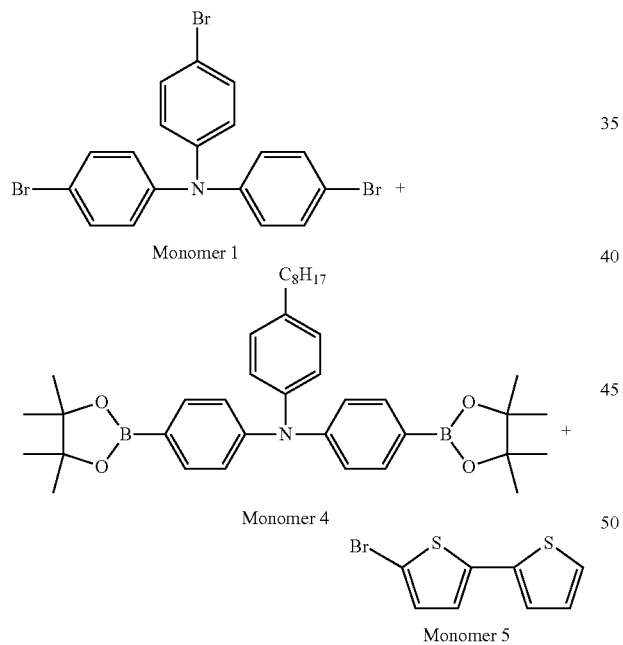

Monomer 1

Monomer 4

Monomer 5

With the exception of charging a three-neck round-bottom flask with the monomer 1 (1.0 mmol), the monomer 4 (2.5 mmol), the monomer 5 (2.0 mmol) and anisole (20 mL), synthesis was performed using the same method as Synthesis Example 1 to obtain a polymer B having bithiophene at the terminals. The weight-average molecular weight was 33,000, and the yield was 33%. The polymer B had units of formula (87a) (corresponding with the monomer 1), formula (1a) (corresponding with the monomer 4), and the thienyl group set (A) (corresponding with the monomer 5), and the relative proportions of those units were 18.2%, 45.5% and 36.4% respectively. Further, the average numbers of units of formula (87a), formula (1a), and the thienyl group set (A) were 23, 56 and 45 respectively.

Synthesis Example 3

Polymer C Having Thiophene Rings at Terminals

[Chemical Formula 33]

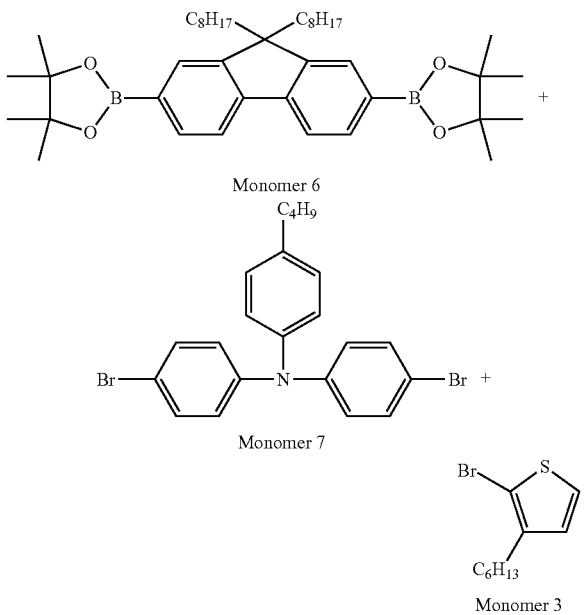

Monomer 6

Monomer 7

Monomer 3

With the exception of charging a three-neck round-bottom flask with the monomer 6 (2.5 mmol), the monomer 7 (2.0 mmol), the monomer 3 (1.0 mmol) and anisole (15 ml), synthesis was performed using the same method as Synthesis Example 1 to obtain a polymer C having thiophene at the terminals. The weight-average molecular weight was 8,000, and the yield was 44%. The polymer C had units of formula (7) (corresponding with the monomer 6), formula (1 a) (corresponding with the monomer 7), and the thienyl group set (A) (corresponding with the monomer 3), and the relative proportions of those units were 45.5%, 36.4% and 18.2% respectively. Further, the average numbers of units of formula (7), formula (1 a), and the thienyl group set (A) were 11, 9 and 5 respectively.

Synthesis Example 4

Polymer D Having Thiophene Rings at Terminals

[Chemical Formula 34]

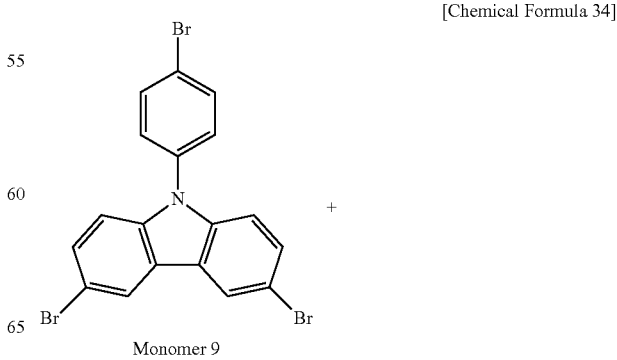

Monomer 9

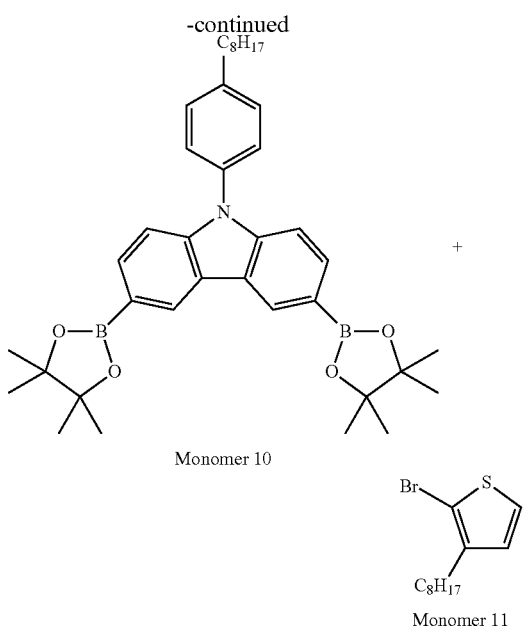

Monomer 10

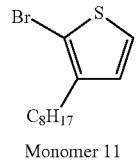

Monomer 11

With the exception of charging a three-neck round-bottom flask with the monomer 9 (1.0 mmol), the monomer 10 (2.5 mmol), the monomer 11 (2.0 mmol) and anisole (8 ml), synthesis was performed using the same method as Synthesis Example 1 to obtain a polymer D having thiophene at the terminals. The weight-average molecular weight was 35,000, and the yield was 40%. The polymer D had units of formula (91a) (corresponding with the monomer 9), formula (15a) (corresponding with the monomer 10), and the thienyl group set (A) (corresponding with the monomer 11), and the relative proportions of those units were 18.2%, 45.5% and 36.4% respectively. Further, the average numbers of units of formula (91a), formula (15a), and the thienyl group set (A) were 23, 58 and 46 respectively.

Synthesis Example 5

Polymer E Having Thiophene Rings at Terminals

[Chemical Formula 35]

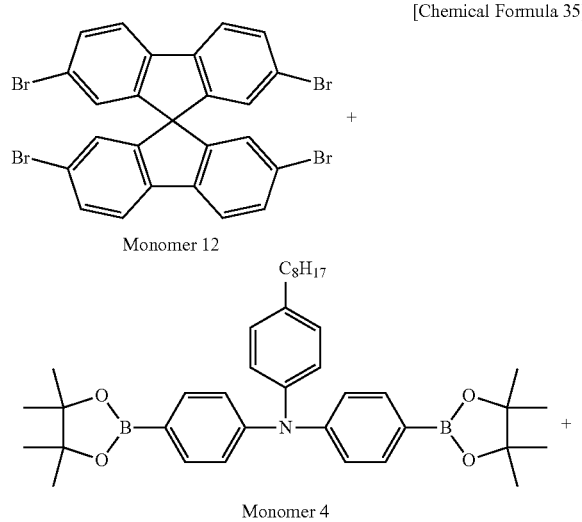

Monomer 12

Monomer 4

Monomer 11

With the exception of charging a three-neck round-bottom flask with the monomer 12 {0.75 mmol), the monomer 4 (2.5 mmol), the monomer 11 {2.0 mmol) and anisole (8 ml), synthesis was performed using the same method as Synthesis Example 1 to obtain a polymer E having thiophene at the terminals. The weight-average molecular weight was 41,000, and the yield was 38%. The polymer E had units of formula (31) (corresponding with the monomer 12), formula (1a) (corresponding with the monomer 4), and the thienyl group set (A) (corresponding with the monomer 11), and the relative proportions of those units were 14.3%, 47.6% and 38.1% respectively. Further, the average numbers of units of formula (31), formula (1a), and the thienyl group set {A} were 20, 68 and 54 respectively.

Synthesis Example 6

Polymer F Having Thiophene Rings at Terminals

[Chemical Formula 36]

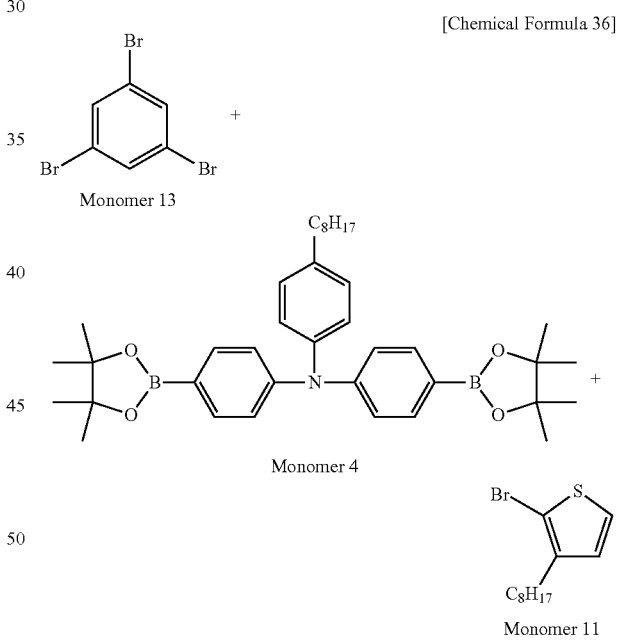

Monomer 13

Monomer 4

Monomer 11

With the exception of charging a three-neck round-bottom flask with the monomer 13 {1.0 mmol), the monomer 4 (2.5 mmol), the monomer 11 (2.0 mmol) and anisole {8 ml), synthesis was performed using the same method as Synthesis Example 1 to obtain a polymer F having thiophene at the terminals. The weight-average molecular weight was 13,000, and the yield was 33%. The polymer F had units of formula (30) (corresponding with the monomer 13), formula (1a) (corresponding with the monomer 4), and the thienyl group set (A) {corresponding with the monomer 11), and the relative proportions of those units were 18.2%, 45.5% and 36.4% respectively. Further, the average numbers of units of formula (30), formula (1 a), and the thienyl group set (A) were 7, 24 and 20 respectively.

Preparation of Ink Compositions

Example 1

Each of the polymers A to F obtained above was dissolved in toluene (polymer 4.5 mg/465 μL), and an ethyl acetate solution of one of initiators 1 to 8 (50 μL, initiator concentration: 10 μg/1 μL) was added, thus preparing a series of ink compositions. All of the ink compositions were obtained as uniform solutions. Further, the ink compositions which used an initiator having an ammonium ion, anilinium ion, iodonium ion or sulfonium ion as the cation exhibited particularly superior storage stability.

Comparative Example 1

With the exception of not adding the initiator, ink compositions were prepared under the same conditions as Example 1. A uniform solution could be obtained.
<Preparation of Thin Films (Organic Layers) Having Solvent Resistance>
(Evaluation of Residual Film Ratio)

Each of the ink compositions prepared in Example 1 and Comparative Example 1 were spin-coated onto a quartz glass plate having dimensions of 22 mm×29 mm×thickness 1 mm, at room temperature (25° C.) and at 3,000 min-1, thus forming a thin film (1). Subsequently, the thin film (1) was heated and cured on a hotplate at 210° C. for 10 minutes, thus forming a thin film (2) (50 nm). The film thickness was measured using a Probe-based level difference and surface shape measurement apparatus XP-2 manufactured by Techscience Ltd. This thin film (2) was grasped with a pair of tweezers together with the quartz glass plate, dipped in a 200 ml beaker filled with toluene (25° C.), and rinsed by moving the substrate back and forth in the thickness direction 10 times in a period of 10 seconds, thus obtaining a thin film (3). The residual ratio for the thin film (3) (the residual film ratio) was determined from the ratio of the absorbance values for the thin film before and after rinsing. The results are shown in Table 1.

The measurement conditions for the absorbance were as follows.

Measurement of the absorbance was performed using a spectrophotometer (U-3310, manufactured by Hitachi, Ltd.). For the thin film, the absorbance at the absorption maximum within a range from 300 to 420 nm was determined.

TABLE 1

Results of evaluating solvent resistance of thin films

| | Residual film ratio (%) | | | | | |
|---|---|---|---|---|---|---|
| | Polymer A | Polymer B | Polymer C | Polymer D | Polymer E | Polymer F |
| Initiator 1 | 99 | 99 | 83 | 93 | 99 | 85 |
| Initiator 2 | 53 | 66 | 50 | 60 | 58 | 54 |
| Initiator 3 | 61 | 70 | 55 | 60 | 66 | 56 |
| Initiator 4 | 89 | 96 | 80 | 85 | 95 | 77 |
| Initiator 5 | 98 | 99 | 87 | 98 | 99 | 88 |
| Initiator 6 | 91 | 95 | 85 | 90 | 92 | 83 |
| Initiator 7 | 98 | 99 | 88 | 93 | 99 | 80 |
| Initiator 8 | 98 | 98 | 83 | 93 | 99 | 83 |
| None (Comparative Example) | 6 | 11 | 5 | 8 | 10 | 8 |

As is clear from Table 1, the thin films (organic layers) obtained using the ink compositions according to the embodiment of the present invention exhibited excellent results, with a residual film ratio of 50% or greater. Even in those cases where the polymer contained within the composition contained no typical polymerizable substituents such as styryl groups or oxetane groups, the thin film (organic layer) obtained from the composition capable of changing its solubility still exhibited solvent resistance. Using the composition capable of changing its solubility enables multilayering of an organic electronic element to be achieved using a coating method.

[Chemical Formula 37]

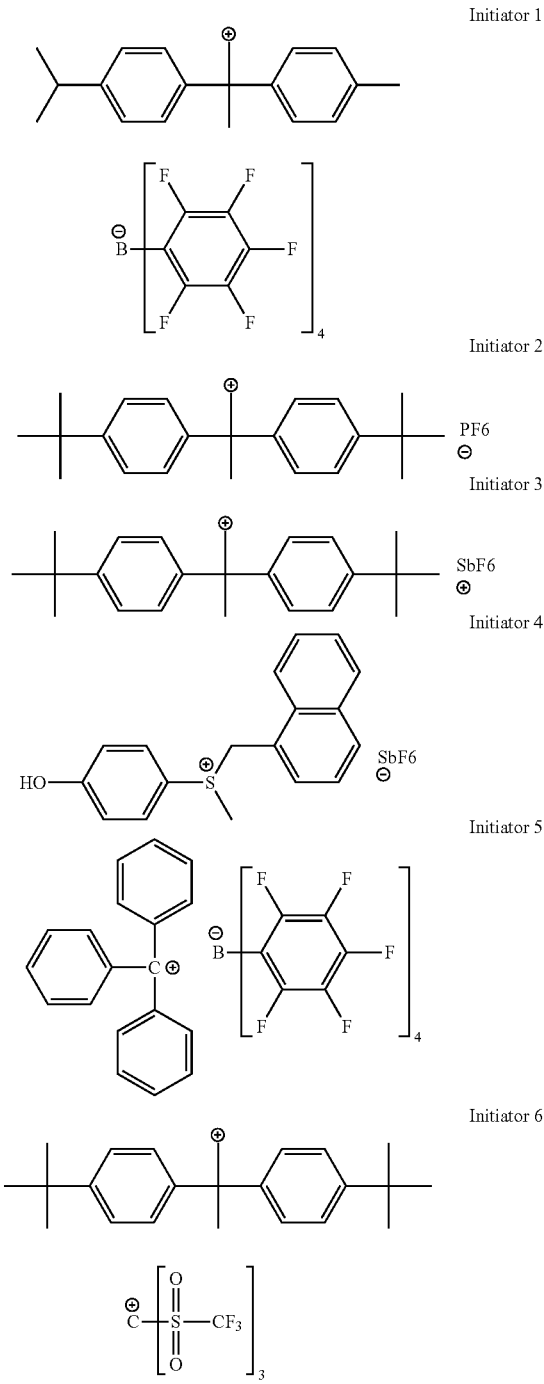

Initiator 7

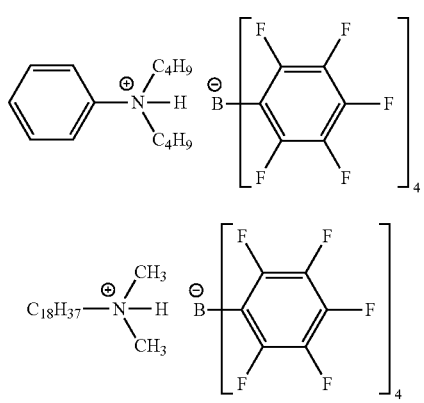

Initiator 8

Preparation of Organic EL Elements

Example 2

Organic EL Properties

The polymer A obtained above was dissolved in toluene (polymer 4.5 mg/465 μL), and an ethyl acetate solution of the initiator 1 (50 μL, initiator concentration: 10 μg/1 μL) was added to prepare an ink composition. This ink composition was spin-coated at 3,000 min-1 onto a glass substrate patterned with an ITO pattern having a width of 1.6 mm, thus forming a thin film. The thin film was heated and cured on a hotplate at 210° C. for 10 minutes, thereby forming a hole injection layer (thickness: 50 nm).

Subsequently, a toluene solution (1.0% by weight) of a mixture composed of a polymer 1 (75% by weight), a polymer 2 (20% by weight) and a polymer 3 (5% by weight), represented by the structural formulas shown below, was spin-coated onto the hole injection layer at 3,000 min-1 to form a thin film. The thin film was heated on a hotplate at 80° C. for 5 minutes, thus forming a polymer light-emitting layer (thickness: 80 nm). The polymer light-emitting layer was able to be laminated without dissolving the hole injection layer.

[Chemical Formula 38]

Polymer 1

Polymer 2

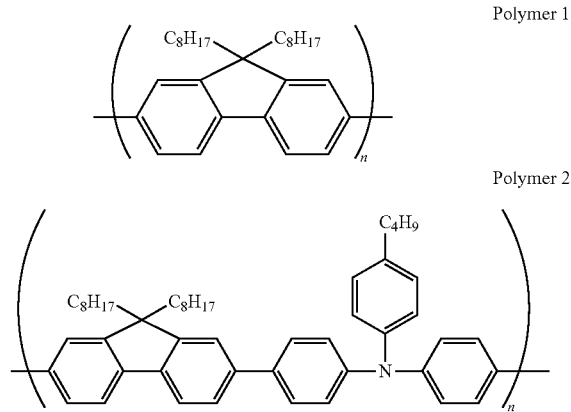

Polymer 3

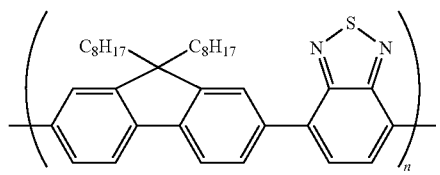

The thus obtained glass substrate was then transferred into a vacuum deposition apparatus, and an electrode was formed on the polymer light-emitting layer by sequentially depositing Ba (thickness: 3 nm) and Al {thickness: 100 nm).

Following formation of the electrode, the glass substrate was transferred to a dry nitrogen environment without exposure to the atmosphere. A sealing glass formed from an alkali-free glass of thickness 0.7 mm having a counterbore with a depth of 0.4 mm formed therein and the glass substrate were bonded together using a photocurable epoxy resin, thereby sealing the substrate and completing preparation of a polymer organic EL element having a multilayer structure. The evaluations described below were performed in an open atmosphere at room temperature (25° C.).

When a voltage was applied to this organic EL element using the ITO as the anode and the Al as the cathode, a green light emission was observed at a voltage of approximately 3 V. The current efficiency was 13.1 cd/A at a luminance of 5,000 cd/m2, and the drive voltage was 5.0 V. The current-voltage characteristics were measured using a picoammeter 41408 manufactured by Hewlett Packard Corporation, and the emission luminance was measured using a luminance meter Pritchard 19808 manufactured by Photo Research, Inc.

Comparative Example 2

Organic EL Properties

With the exception of not adding the initiator 1, an organic EL element was prepared under the same conditions as Example 2. During formation of the polymer light-emitting layer, the hole injection layer and the polymer light-emitting layer underwent mutual mixing, and a laminated structure could not be prepared. When a voltage was applied to this organic EL element using the ITO as the anode and the Al as the cathode, uniform light emission could not be achieved.

Preparation of Organic Thin-Film Solar Cells

Example 3

Organic Thin-Film Solar Cell Properties

The polymer B obtained above was dissolved in toluene (polymer 4.5 mg/465 μl), and an ethyl acetate solution of the initiator 4 (50 μl, initiator concentration: 10 μg/1 μl) was added to prepare an ink composition. This ink composition was spin-coated at 3,000 mh1 onto a glass substrate patterned with an ITO pattern having a width of 1.6 mm, thus forming a thin film. The thin film was heated and cured on a hotplate at 210° C. for 10 minutes to form a buffer layer (thickness: 50 nm).

Next, a mixed solution prepared by dissolving 20 mg of each of P3HT and PCBM in 1 ml of chlorobenzene was spin-coated onto the buffer layer, thereby forming a photoelectric conversion layer (thickness: 100 nm). The photoelectric conversion layer was able to be laminated without dissolving the buffer layer.

The thus obtained glass substrate was then transferred into a vacuum deposition apparatus, and Al {thickness: 100 nm) was deposited on the photoelectric conversion layer to complete preparation of an organic photoelectric conversion element.

The thus obtained organic photoelectric conversion element was irradiated with simulated sunlight of AM1 0.5G (100 mW/cm2), the current-voltage characteristics {J-V characteristics) were measured, and the energy conversion efficiency was determined. The energy conversion efficiency was 0.7%.

Comparative Example 3

Organic Thin-Film Solar Cell Properties

With the exception of not adding the initiator 4, an organic photoelectric conversion element was prepared under the same conditions as Example 3. During formation of the photoelectric conversion layer, the buffer layer and the photoelectric conversion layer underwent mutual mixing, and a laminated structure could not be prepared. The energy conversion efficiency was determined in the same manner as Example 3. The energy conversion efficiency was 0.2%.

Preparation of Charge Transport Evaluation Element

Example 4

A mixed solution containing the polymer A (100 mg), the initiator 5 (3.0 mg) and anisole (1.91 ml) was spin-coated at 3,000 min-1 onto a glass substrate patterned with an ITO pattern having a width of 1.6 mm, thus forming a thin film. The thin film was heated on a hotplate at 180° C. for 10 minutes to prepare a charge transport layer (thickness: 125 nm). The thus obtained glass substrate was then transferred into a vacuum deposition apparatus, and Al (thickness: 100 nm) was deposited on the charge transport layer.

Following deposition of the Al, the glass substrate was transferred to a dry nitrogen environment without exposure to the atmosphere. A sealing glass formed from an alkali-free glass of thickness 0.7 mm having a counterbore with a depth of 0.4 mm formed therein and the glass substrate were bonded together using a photocurable epoxy resin, thereby sealing the substrate and completing preparation of a charge transport evaluation element.

In a similar manner, a mixed solution containing the polymer A (100 mg), the initiator 6 (3.0 mg) and anisole (1.91 ml), a mixed solution containing the polymer B (100 mg), the initiator 5 (3.0 mg) and anisole (1.91 ml), and a mixed solution containing the polymer B (100 mg), the initiator 6 (3.0 mg) and anisole (1.91 ml) were also used to prepare charge transport evaluation elements.

Comparative Example 4

[Chemical Formula 39]

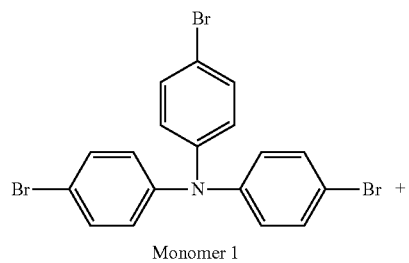

Monomer 1

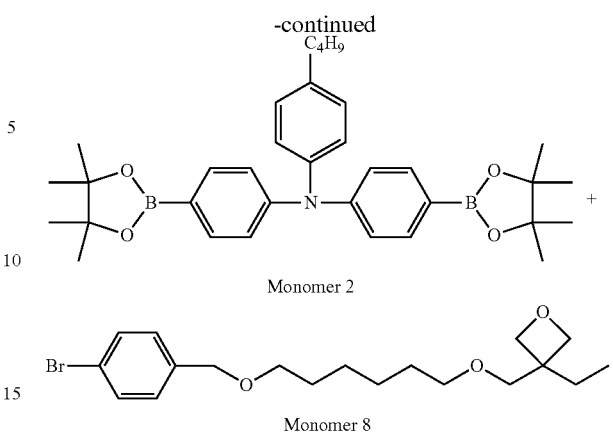

Monomer 2

Monomer 8

A three-neck round-bottom flask was charged with the monomer 1 (2.0 mmol), the monomer 2 (5.0 mmol), the monomer 8 (4.0 mmol) and anisole (20 mL), and the prepared Pd catalyst solution (7.5 ml) was then added. Following stirring of the mixture for 30 minutes, a 10% aqueous solution of tetraethylammonium hydroxide (20 mL) was added. All solvents were deaerated by nitrogen bubbling for at least 30 minutes prior to use. The resulting mixture was heated and refluxed for 2 hours. All operations up until this point were conducted under a stream of nitrogen.

Following completion of the reaction, the organic layer was washed with water, and the organic layer was then poured into methanol-water (9:1). The precipitate that was produced was collected by suction filtration, and washed with methanol-water (9:1). The thus obtained precipitate was dissolved in toluene, and then reprecipitated from methanol. The thus obtained precipitate was collected by suction filtration and dissolved in toluene, and the metal adsorbent (200 mg per 100 mg of polymer) was then added to the solution and stirred overnight. Following completion of the stirring, the metal adsorbent and any insoluble matter was removed by filtration, and the filtrate was concentrated using a rotary evaporator. The resulting concentrate was dissolved in toluene, and then reprecipitated from methanol-acetone (8:3). The produced precipitate was collected by suction filtration, and washed with methanol-acetone (8:3). The thus obtained precipitate was dried under vacuum to obtain a polymer 4. The weight-average molecular weight of the thus obtained polymer 4 was 31,000.

In a similar manner to Example 4, a mixed solution containing the polymer 4 (100 mg), the initiator 5 (3.0 mg) and anisole (1.91 ml), and a mixed solution containing the polymer 4 (100 mg), the initiator 6 (3.0 mg) and anisole (1.91 ml) were used to prepare charge transport evaluation elements.

(Evaluation of Charge Transport Properties)

A voltage was applied to these charge transport evaluation elements using the ITO as the anode and the Al as the cathode, and the change in current upon application of the voltage was measured. Table 2 shows the voltage necessary to achieve a current flow of 10 mA/cm².

TABLE 2

| | Voltage for current flow of 10 mA/cm² | | |
|---|---|---|---|
| | Polymer A | Polymer B | Polymer 4 (Comparative Example) |
| Initiator 5 | 2.2 V | 1.9 V | 3.6 V |
| Initiator 6 | 3.3 V | 3.0 V | 5.1 V |

As is clear from Table 2, compared with the charge transport evaluation element of Comparative Example 4, the charge transport evaluation element of Example 4 exhibited superior charge transport properties, and was able to achieve the same current with a lower voltage. Further, when an initiator having a borate ion as the anion was used, the charge transport evaluation element exhibited particularly superior charge transport properties.

Example 5

A charge transport evaluation element was prepared in the same manner as Example 4, using a mixed solution containing the polymer A (100 mg), the initiator 1 (3.0 mg) and anisole (1.91 ml).

Comparative Example 5

A charge transport evaluation element was prepared in the same manner as Example 4, using a mixed solution containing the polymer 4 (100 mg), the initiator 1 (3.0 mg) and anisole (1.91 ml).
(Evaluation of Charge Transport Properties)

A voltage was applied to these charge transport evaluation elements using the ITO as the anode and the Al as the cathode, and the change in current upon application of the voltage was measured. The results are shown in FIG. 1. The charge transport evaluation element of Example 5 produced a current that was 1,000 times or more that of the charge transport evaluation element of Comparative Example 5 in the low voltage region of 1 V or less. The organic layer that represents an embodiment of the present invention was useful in reducing the drive voltage of the element.

Preparation of Organic EL Elements

Example 6

Organic EL Reliability

A coating solution was prepared by mixing the polymer A obtained above (10 mg), the initiator 1 (0.5 mg) and toluene (1,000 µL). This coating solution was spin-coated at 3,000 min$^{-1}$ onto a glass substrate patterned with an ITO pattern having a width of 1.6 mm, thus forming a thin film. The thin film was heated and cured on a hotplate at 180° C. for 10 minutes, thereby forming a hole injection layer (30 nm). The operations up until this point were performed in an open atmosphere.

The thus obtained glass substrate was transferred into a vacuum deposition apparatus, and αNPD (50 nm), CBP+Ir(ppy)$_3$ (100:6, 30 nm), BAlq (10 nm), Alq$_3$ (30 nm), LiF (thickness: 0.8 nm) and Al (thickness: 150 nm) were deposited sequentially on top of the hole injection layer.

Following formation of the electrode, the glass substrate was transferred to a dry nitrogen environment without exposure to the atmosphere. A sealing glass formed from an alkali-free glass of thickness 0.7 mm having a counterbore with a depth of 0.4 mm formed therein and the glass substrate were bonded together using a photocurable epoxy resin, thereby sealing the substrate and completing preparation of an organic EL element having a multilayer structure. The tests described below were performed in an open atmosphere at room temperature (25° C.).

When a voltage was applied to this organic EL element using the ITO as the anode and the Al as the cathode, a green light emission was observed at a voltage of 4.3 V. The current efficiency at a luminance of 1,000 cd/m$^2$ was 21 cd/A.

Figure 2:
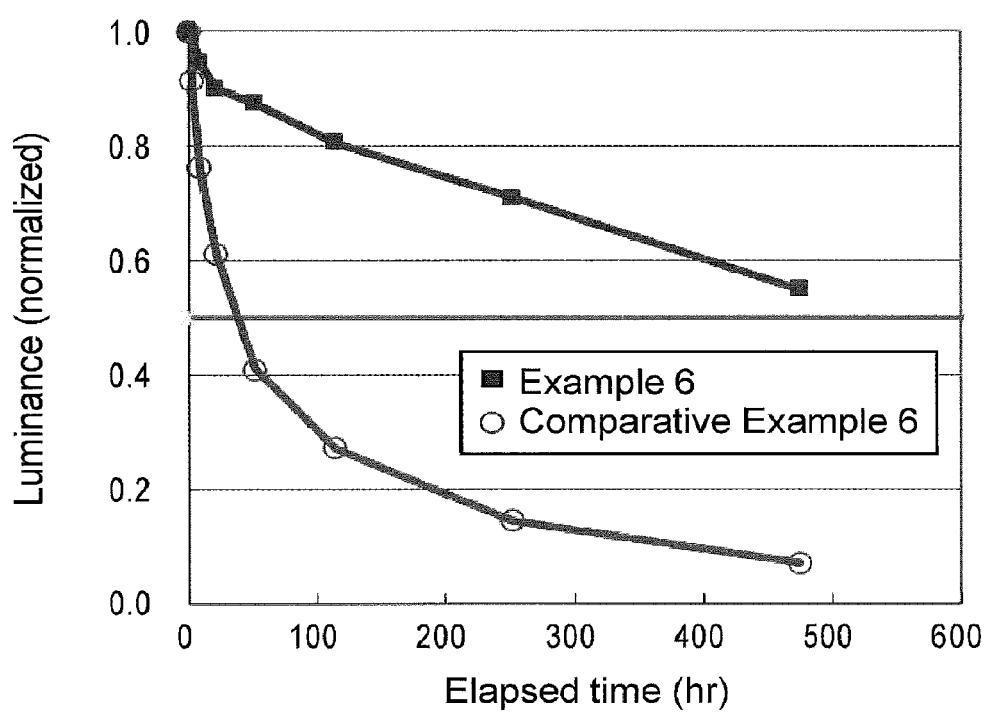
FIG. 2 is a graph illustrating the change in luminance over time of elements obtained in Example 6 and Comparative Example 6.

Further, when the luminance was measured using a BM-7 manufactured by Topcon Corporation while a constant voltage was applied, and the time taken for the luminance to decrease by half from the initial luminance (3,000 cd/m$^2$) was measured as an indication of the lifetime characteristics, the time was 400 hours or longer. The results are shown in FIG. 2.

Comparative Example 6

Organic EL Reliability

A PEDOT:PSS dispersion (A14083 LVW142, manufactured by H.C. Starck-V Tech Ltd.) was spin-coated at 1,500 min$^{-1}$ onto a glass substrate patterned with an ITO pattern having a width of 1.6 mm, and the dispersion was heated and dried on a hotplate in the open air at 200° C. for 10 minutes, thus forming a hole injection layer (40 nm). Thereafter, the same method as Example 6 was used to prepare an organic EL element having a multilayer structure.

When evaluation was performed in the same manner as Example 6, a green light emission was observed at 4.5 V, and the current efficiency at a luminance of 1,000 cd/m$^2$ was 20 cd/A. The time taken for the luminance to decrease by half from the initial luminance (3,000 cd/m2) was 37 hours.

The effects of the embodiments of the present invention were illustrated above using a series of examples. Besides the compositions described in the examples, similar excellent effects can be obtained using compositions containing the polymer or oligomer (A) and the initiator (8) described above. In other words, the composition according to an embodiment of the present invention can be prepared easily, and undergoes a satisfactory change in solubility, and therefore by using this composition, organic layers can be multilayered with ease. Further, a composition that uses an initiator (B) having particularly superior storage stability undergoes a satisfactory change in solubility even after storage for a long period of time, and therefore exhibits excellent workability.

Polymerizable substituents such as styryl groups and oxetane groups are substituents that do not provide functions such as charge transport, charge recombination, or light emission, and in organic layers formed using a composition containing a polymer or oligomer into which these types of polymerizable groups have been introduced, the functional sites for charge transport, charge recombination and light emission and the like undergo a relative dilution, meaning there is a possibility of a deterioration in the properties of the organic electronic element. By using the composition capable of changing its solubility that represents an embodiment of the present invention, the drive voltage for an organic electronic element can be reduced, and the luminous efficiency, the electrical efficiency and the lifetime and the like can be improved.

The invention claimed is:
1. A composition comprising a polymer or oligomer (A) having a unit with hole transport properties and also having a thienyl group which may have a substituent, and an initiator (B), wherein solubility of the composition is capable of being changed by applying heat, light, or both heat and light, and wherein the polymer or oligomer (A) has at least one type of structure selected from the group consisting of a structure represented by formula (Ia) shown below, and a structure represented by formula (Ib) shown below:

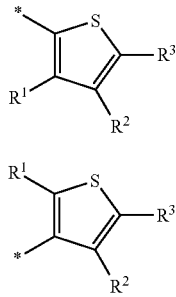

Formula (Ia)

Formula (Ib)

wherein, in formulas (Ia) and (Ib), each of $R^1$ to $R^3$ independently represents a hydrogen atom or an alkyl group, provided that at least one of $R^1$ to $R^3$ represents a hydrogen atom.

2. The composition according to claim 1, wherein the unit with hole transport properties comprises at least one type of unit selected from the group consisting of a unit containing an aromatic amine structure and a unit containing a carbazole structure.

3. The composition according to claim 1, wherein the polymer or oligomer (A) has a thienyl group at a terminal thereof.

4. The composition according to claim 1, wherein the polymer or oligomer (A) has a branched structure and 3 or more terminals, and has a thienyl group at each of 3 or more of all of the terminals.

5. A composition comprising a polymer or oligomer (A) having a unit with hole transport properties and also having a thienyl group which may have a substituent, and an initiator (B), wherein solubility of the composition is capable of being changed by applying heat, light, or both heat and light, and wherein the polymer or oligomer (A) has at least one type of structure selected from the group consisting of a structure represented by formula (IIa), a structure represented by formula (IIb), a structure represented by formula (IIIa), and a structure represented by formula (IIIb), all of which are shown below:

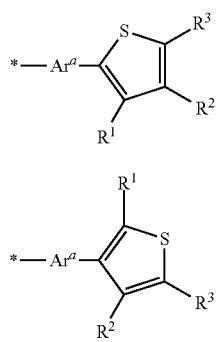

Formula (IIa)

Formula (IIb)

wherein, in formulas (IIa) and (IIb), each of $R^1$ to $R^3$ independently represents a hydrogen atom or an alkyl group, provided that at least one of $R^1$ to $R^3$ represents a hydrogen atom, and $Ar^a$ represents an arenediyl group or a heteroarenediyl group,

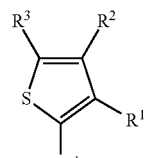

Formula (IIIa)

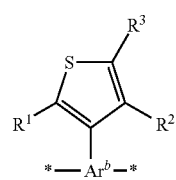

Formula (IIIb)

wherein, in formulas (IIIa) and (IIIb), each of $R^1$ to $R^3$ independently represents a hydrogen atom or an alkyl group, provided that at least one of $R^1$ to $R^3$ represents a hydrogen atom, and $Ar^b$ represents an arenetriyl group or a heteroarenetriyl group.

6. The composition according to claim 1, wherein the initiator (B) is an oxidizing agent.

7. A composition comprising a polymer or oligomer (A) having a unit with hole transport properties and also having a thienyl group which may have a substituent, and an initiator (B), wherein solubility of the composition is capable of being changed by applying heat, light, or both heat and light, and wherein the initiator (B) is an onium salt.

8. The composition according to claim 1, wherein a weight-average molecular weight of the polymer or oligomer (A) is from 1,000 to 1,000,000.

9. The composition according to claim 1, further comprising a solvent (C).

10. A hole transport material composition comprising the composition according to claim 1.

11. An ink composition comprising the composition according to claim 1.

12. The composition according to claim 7, wherein the unit with hole transport properties comprises at least one type of unit selected from the group consisting of a unit containing an aromatic amine structure and a unit containing a carbazole structure.

13. The composition according to claim 7, wherein the polymer or oligomer (A) has at least one type of structure selected from the group consisting of a structure represented by formula (Ia) shown below, and a structure represented by formula (Ib) shown below:

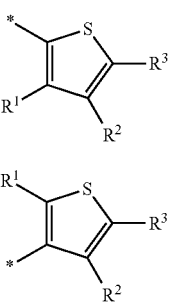

Formula (Ia)

Formula (Ib)

wherein, in formulas (Ia) and (Ib), each of $R^1$ to $R^3$ independently represents a hydrogen atom or an alkyl group, provided that at least one of $R^1$ to $R^3$ represents a hydrogen atom.

14. The composition according to claim 7, wherein the polymer or oligomer (A) has a thienyl group at a terminal thereof.

15. The composition according to claim 7, wherein the polymer or oligomer (A) has a branched structure and 3 or more terminals, and has a thienyl group at each of 3 or more of all of the terminals.

16. The composition according to claim 7, wherein the polymer or oligomer (A) has at least one type of structure selected from the group consisting of a structure represented by formula (IIa), a structure represented by formula (IIb), a structure represented by formula (IIIa), and a structure represented by formula (IIIb), all of which are shown below:

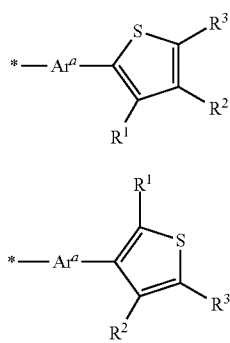

Formula (IIa)

Formula (IIb)

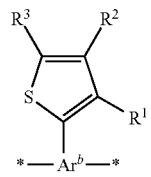

Formula (IIIa)

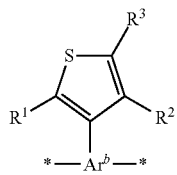

Formula (IIIb)

wherein, in formulas (IIa) and (IIb), each of $R^1$ to $R^3$ independently represents a hydrogen atom or an alkyl group, provided that at least one of $R^1$ to $R^3$ represents a hydrogen atom, and $Ar^a$ represents an arenediyl group or a heteroarenediyl group, wherein, in formulas (IIIa) and (IIIb), each of $R^1$ to $R^3$ independently represents a hydrogen atom or an alkyl group, provided that at least one of $R^1$ to $R^3$ represents a hydrogen atom, and $Ar^b$ represents an arenetriyl group or a heteroarenetriyl group.

17. The composition according to claim 7, wherein a weight-average molecular weight of the polymer or oligomer (A) is from 1,000 to 1,000,000.

18. The composition according to claim 7, further comprising a solvent (C).

19. A hole transport material composition comprising the composition according to claim 7.

20. An ink composition comprising the composition according to claim 7.

* * * * *